(12) United States Patent
Nishimura et al.

(10) Patent No.: US 7,231,273 B2
(45) Date of Patent: Jun. 12, 2007

(54) SUBSTRATE PROCESSING APPARATUS AND METHOD INCLUDING OBSTACLE DETECTION

(75) Inventors: Joichi Nishimura, Kyoto (JP); Masami Otani, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 0 days.

(21) Appl. No.: 11/005,578

(22) Filed: Dec. 6, 2004

(65) Prior Publication Data

US 2005/0123386 A1    Jun. 9, 2005

(30) Foreign Application Priority Data

Dec. 9, 2003    (JP)    ............... 2003-410693

(51) Int. Cl.
*G06F 19/00*    (2006.01)
*H01L 21/00*    (2006.01)
*H01L 21/68*    (2006.01)

(52) U.S. Cl. .................. 700/112; 700/59; 700/255; 414/935

(58) Field of Classification Search ............... 700/112, 700/59, 255, 259; 414/935; 382/103; 340/673; 438/5

See application file for complete search history.

(56) References Cited

U.S. PATENT DOCUMENTS 6,452,503 B1 *    9/2002    Weiss .................. 340/673
6,504,144 B1 *    1/2003    Murata ................ 250/224
6,565,046 B2 *    5/2003    Uebel .................. 246/120
6,779,760 B2 *    8/2004    Chang et al. ......... 246/1 C
2005/0207616 A1 *    9/2005    Brad et al. ........... 382/103

FOREIGN PATENT DOCUMENTS

| JP | 05-050880 | 3/1993 |
| JP | 05-143147 | 6/1993 |
| JP | 09-260261 | 10/1997 |
| JP | 10-214768 | 8/1998 |
| JP | 11-329912 | 11/1999 |
| JP | 2000-195924 | * 7/2000 |
| JP | 2000-232145 | * 8/2000 |

* cited by examiner

*Primary Examiner*—Leo Picard
*Assistant Examiner*—Steven R. Garland
(74) *Attorney, Agent, or Firm*—Ostrolenk, Faber, Gerb & Soffen, LLP

(57) ABSTRACT

A camera is fixed to a camera fixture extending forward and upward from a rear end of an arm mechanism. The camera picks up the direction of extension of the arm mechanism when the substrate is carried in and out. If a normal still image in a hot plate unit previously recorded and a still image picked up by the camera coincide with each other, a substrate transport robot TR carries in and out the substrate.

12 Claims, 19 Drawing Sheets

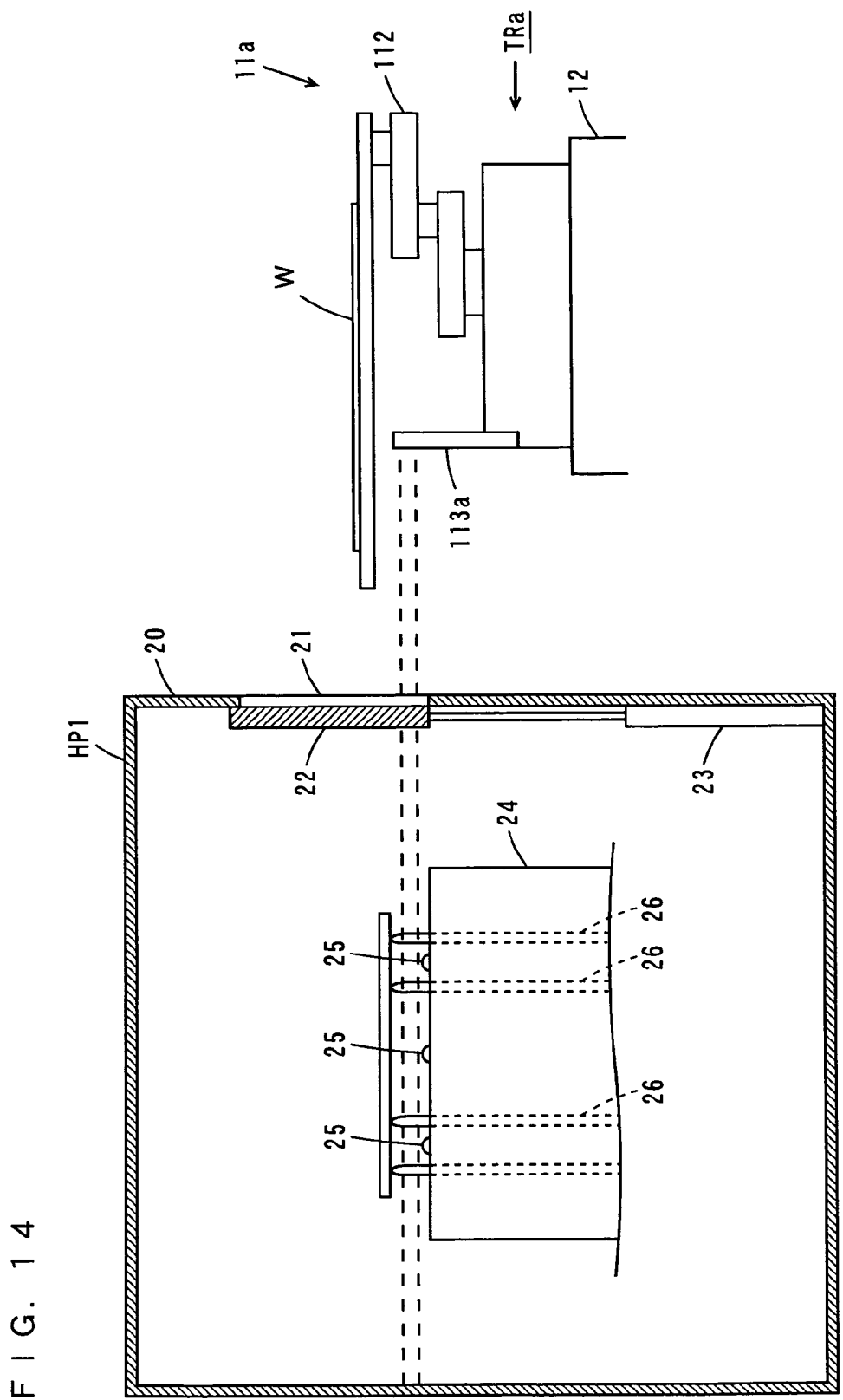
F I G. 14

SUBSTRATE PROCESSING APPARATUS AND METHOD INCLUDING OBSTACLE DETECTION

BACKGROUND OF THE INVENTION

1. Field of the Invention

The present invention relates to a substrate processing apparatus and a substrate processing method for subjecting a substrate to predetermined processing.

2. Description of the Background Art

Conventionally, substrate processing apparatuses have been provided with a plurality of processing units such as liquid processing units and thermal processing units. In order to subject a substrate to a series of processings, a substrate transport robot for carrying the substrate among the plurality of processing units is provided (see JP-A-11-329912).

Each of the processing units is provided with a shutter. When the substrate is carried in and out, the shutter is opened, so that the substrate can be carried in and out by the substrate transport robot. Further, the shutter is closed while the substrate is being processed.

When the shutter is not opened due to inferior operation or the like at the time of carrying in the substrate, collisions between the substrate transport robot and the shutter cannot be avoided so that the substrate is damaged. Even when there exists a substrate receiving member in a carrying passage of the substrate transport robot due to inferior operation of the substrate receiving member, for example, within each of the processing units, collisions between the substrate transport robot and the substrate receiving member cannot be also avoided so that the substrate is damaged.

SUMMARY OF THE INVENTION

An object of the present invention is to provide a substrate processing apparatus and a substrate processing method capable of preventing collisions between a substrate transport device and an obstacle.

A substrate processing apparatus according to an aspect of the present invention comprises a processing unit; a substrate transport device that transports a substrate; and a controller that controls the operation of the substrate transport device, the substrate transport device including an obstacle detecting device that detects an obstacle in a direction toward the processing unit, and the controller controlling the operation of the substrate transport device on the basis of the results of the detection by the obstacle detecting device.

In the substrate processing apparatus, the obstacle in the direction toward the processing unit is detected by the obstacle detecting device, and an operation for transporting the substrate by the substrate transport device is controlled on the basis of the results of the detection. Consequently, collisions between the substrate transport device and the obstacle can be prevented.

The obstacle detecting device may include an image pick-up device that obtains an image in the direction toward the processing unit. In this case, the obstacle detecting device detects the obstacle on the basis of the image obtained by the image pick-up device. Consequently, the obstacle can be detected with high precision. As a result, collisions between the substrate transport device and the obstacle can be prevented more reliably.

The image pick-up device may output a still image (still picture) in the direction toward the processing unit. In this case, the obstacle detecting device detects the obstacle on the basis of the still image obtained by the image pick-up device. Consequently, the obstacle can be instantaneously detected with high precision. As a result, collisions between the substrate transport device and the obstacle can be prevented more reliably.

The substrate transport device may further include a storage device that stores a reference image in the direction toward the processing unit, and the controller may cause the substrate transport device to transport the substrate when the still image outputted by the image pick-up device and the reference image stored in the storage device coincide with each other.

In this case, when it is determined that there exists no obstacle because the still image obtained by the image pick-up device and the reference image coincide with each other, the substrate is transported by the substrate transport device. Consequently, collisions between the substrate transport device and the obstacle can be reliably prevented.

The controller may stop the operation of the substrate transport device when the still image outputted by the image pick-up device and the reference image stored in the storage device do not coincide with each other.

In this case, when it is determined that there exists an obstacle because the still image obtained by the image pick-up device and the reference image do not coincide with each other, the operation of the substrate transport device is stopped. Consequently, collisions between the substrate transport device and the obstacle can be reliably prevented.

The image pick-up device may obtain an image at a substrate carry-in/carry-out opening of the processing unit. In this case, the obstacle in a direction from the substrate transport device to the substrate carry-in/carry-out opening is detected on the basis of the image obtained by the image pick-up device. Therefore, collisions between the substrate transport device and the obstacle can be reliably prevented when the obstacle exists in the substrate carry-in/carry-out opening and the processing unit.

The obstacle detecting device may include a detector that detects the presence or absence of the obstacle in the direction toward the processing unit. In this case, the obstacle in the direction toward the processing unit is detected by the detector. Therefore, collisions between the substrate transport device and the obstacle can be reliably prevented when the obstacle exists in the processing unit.

A substrate processing method according to another aspect of the present invention comprises the steps of transporting a substrate by a substrate transport device; detecting an obstacle in a direction toward a processing unit by an obstacle detecting device provided in the substrate transport device; and controlling the operation of the substrate transport device on the basis of the results of the detection by the obstacle detecting device.

In the substrate processing method, the obstacle in the direction toward the processing unit is detected by the obstacle detecting device, and an operation for transporting the substrate by the substrate transport device is controlled on the basis of the results of the detection. Consequently, collisions between the substrate transport device and the obstacle can be prevented.

The step of detecting the obstacle may include the step of obtaining an image in the direction toward the processing unit by the image pick-up device. In this case, the obstacle detecting device detects the obstacle on the basis of an image obtained by the image pick-up device. Consequently, the obstacle can be detected with high precision. As a result, collisions between the substrate transport device and the obstacle can be prevented more reliably.

The step of obtaining the image may include the step of outputting a still image in the direction toward the processing unit by the image pick-up device. In this case, the obstacle detecting device detects the obstacle on the basis of the still image obtained by the image pick-up device. Consequently, the obstacle can be instantaneously detected with high precision. As a result, collisions between the substrate transport device and the obstacle can be prevented more reliably.

The substrate processing method may further comprise the step of storing a reference image in the direction toward the processing unit by a storage device provided in the substrate transport device, the controlling step may include the step of causing the substrate transport device to transport the substrate when the still image outputted by the image pick-up device and the reference image stored in the storage device coincide with each other.

In this case, when it is determined that there exists no obstacle because the still image obtained by the image pick-up device and the reference image coincide with each other, the substrate is transported by the substrate transport device. Consequently, collisions between the substrate transport device and the obstacle can be reliably prevented.

The controlling step may include the step of stopping the operation of the substrate transport device when the still image outputted by the image pick-up device and the reference image stored in the storage device do not coincide with each other.

In this case, when it is determined that there exists an obstacle because the still image obtained by the image pick-up device and the reference image do not coincide with each other, the operation of the substrate transport device is stopped. Consequently, collisions between the substrate transport device and the obstacle can be reliably prevented.

The step of obtaining the image may include the step of obtaining an image at a substrate carry-in/carry-out opening of the processing unit by the image pick-up device. In this case, the obstacle in the direction from the substrate transport device to the substrate carry-in/carry-out opening is detected on the basis of the image obtained by the image pick-up device. Therefore, collisions between the substrate transport device and the obstacle can be reliably prevented when the obstacle exists in the substrate carry-in/carry-out opening and the processing unit.

The step of detecting the obstacle may include the step of detecting the presence or absence of the obstacle in the direction toward the processing unit by a detector. In this case, the obstacle in the direction toward the processing unit is detected by the detector. Therefore, collisions between the substrate transport device and the obstacle can be reliably prevented when the obstacle exists in the processing unit.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 14 is a schematic sectional view of a hot plate unit and a substrate transport robot in a case where a substrate is carried out of the hot plate unit;

DESCRIPTION OF THE PREFERRED EMBODIMENTS

Figure 1:
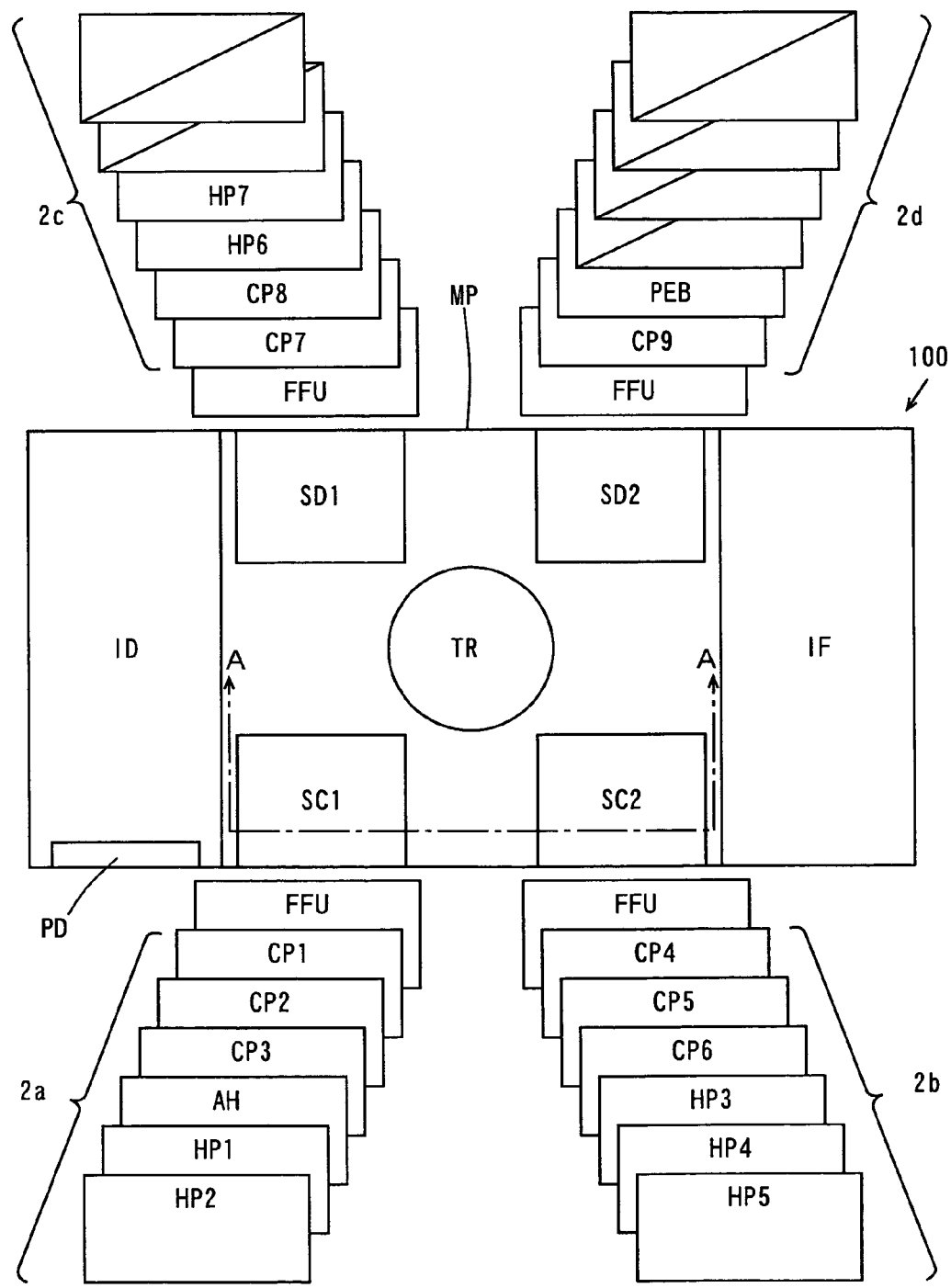
FIG. 1 is a schematic view showing the configuration of a substrate processing apparatus according to a first embodiment.

An embodiment of the present invention will be described while referring to the drawings.

In the following description, examples of a substrate include a semiconductor wafer, a glass substrate for a liquid crystal display device, a glass substrate for a PDP (Plasma Display Panel), a glass substrate for a photomask, and a substrate for an optical disk.

(First Embodiment)

FIG. 1 is a schematic view showing the configuration of a substrate processing apparatus 100 according to the present embodiment.

As shown in FIG. 1, the substrate processing apparatus 100 comprises an indexer ID, a processing unit section MP, and an interface IF.

The indexer ID carries a substrate W into and out of the substrate processing apparatus 100. The processing unit section MP comprises a plurality of processing units for processing the substrate W and a substrate transport robot TR for transporting the substrate W into and out of each of the processing units. Further, on a side surface of the indexer ID, there is provided an operation panel PD on which information such as the processing conditions of the substrate W are displayed and to which a user allows operation entry.

The interface IF transfers and receives the substrate W between an exposure device (not shown) and the processing unit section MP. The interface IF transfers the substrate W which has been coated with resist in the processing unit section MP to the exposure device and receives the substrate W which has been exposed from the exposure device. The interface IF comprises a robot (not shown) for transferring and receiving the substrate W to and from the substrate transport robot TR, and buffer cassettes (not shown) on which the substrates are placed. Consequently, the interface IF has the function of temporarily storing the substrate W.

The processing unit section MP comprises a tank storing a medical agent at its lowermost part, and a chemical cabinet (not shown) accommodating a piping or the like. Coating processing units SC1 and SC2 and development processing units SD1 and SD2 for processing the substrate W using a processing liquid are arranged at four corners on the chemical cabinet.

The coating processing units SC1 and SC2 perform resist coating processing while rotating the substrate W. The development processing units SD1 and SD2 subject the substrate W which has been exposed to development processing while rotating the substrate W. The coating processing units SC1 and SC2 and the development processing units SD1 and SD2 are hereinafter generically referred to as a liquid processing unit.

A filter fan unit FFU forming down flow of clean air is provided on each of the coating processing units SC1 and SC2 and the development processing units SD1 and SD2. Further, multi-stage thermal processing units 2a to 2d for subjecting the substrate W to thermal processing are respectively provided on the filter fan units FFU.

Thermal processing units in six stages are arranged in the multi-stage thermal processing unit 2a. Cooling plate units CP1 to CP3 for subjecting the substrate W to cooling processing are provided in the first to third stages from the lowermost stage. An adhesion unit AH for subjecting the substrate W to adhesion processing is provided in the fourth stage from the lowermost stage, and hot plate units HP1 and HP2 for subjecting the substrate W to heating processing are provided in the fifth and sixth stages from the lowermost stage.

Thermal processing units in six stages are also arranged in the multi-stage processing unit 2b. Cooling plate units CP4 to CP6 are provided in the first to third stages from the lowermost stage. Hot plate units HP3 to HP5 are provided in the fourth to sixth stages from the lowermost stage.

Thermal processing units in four stages are arranged in the multi-stage processing unit 2c. Cooling plate units CP7 and CP8 are respectively provided in the first and second stages from the lowermost stage, and hot plate units HP6 and HP7 are respectively provided in the third and fourth stages from the lowermost stage. Although the two stages from the uppermost stage are in an empty state in the substrate processing apparatus 100 according to the present embodiment, a hot plate unit, a cooling plate unit, or the other thermal processing unit may be arranged therein depending on the application and purpose.

Thermal processing units in two stages are arranged in the multi-stage processing unit 2d. A cooling plate unit CP9 is provided in the first stage from the lowermost stage, and a post-exposure bake plate unit PEB for subjecting the substrate W to post exposure baking is provided in the second stage from the lowermost stage. Although the stages above the post-exposure back plate PEB are in an empty state, a hot plate unit, a cooling plate unit, or the other thermal processing unit may be arranged therein depending on the application and purpose.

The substrate transport robot TR is provided at the center of the processing unit section MP. The substrate transport robot TR successively carries the substrate W into and out of each of the liquid processing units and the thermal processing units. Consequently, the substrate W can be subjected to a series of processings in the substrate processing apparatus 100.

Figure 2:
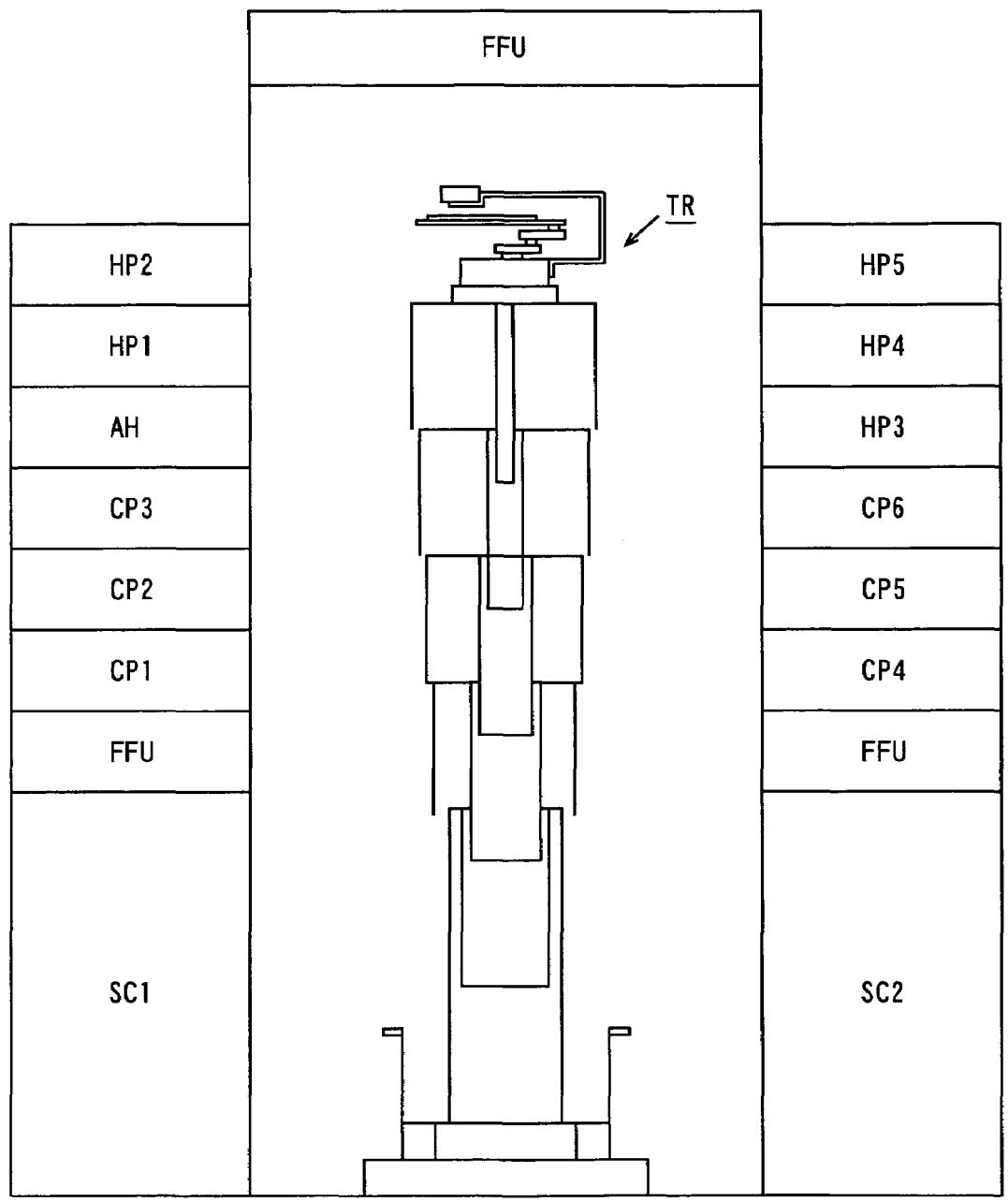
FIG. 2 is a schematic sectional view taken along a line A—A shown in FIG. 1.

FIG. 2 is a schematic sectional view taken along a line A—A shown in FIG. 1.

As shown in FIG. 2, the filter fan unit FFU forming down flow of clean air is provided in an uppermost part of the processing unit section MP in the substrate processing apparatus 100. Consequently, the inside of the processing unit section MP is kept in a clean atmosphere.

Figure 3:
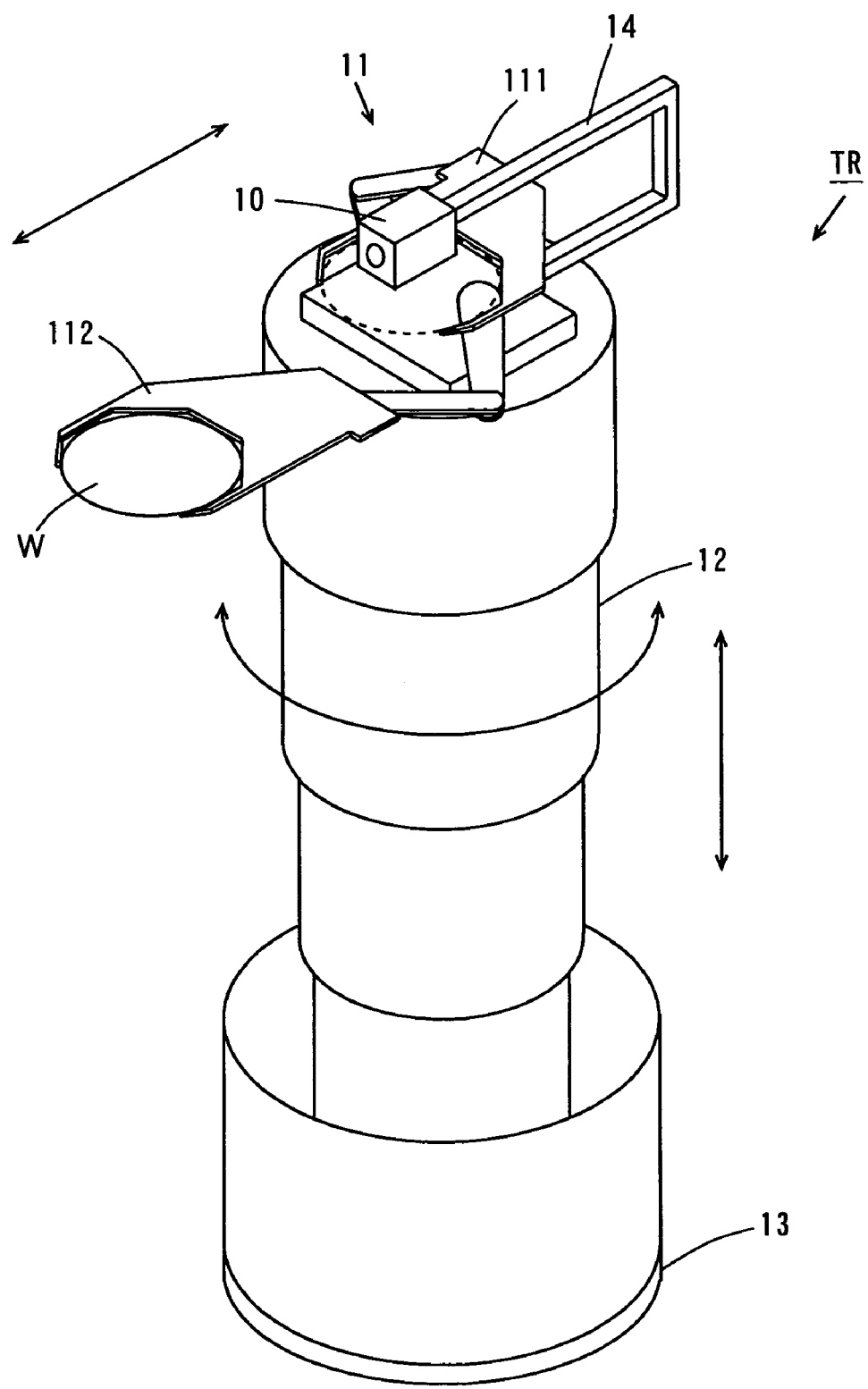
FIG. 3 is a perspective view of a transport robot shown in FIG. 1.

FIG. 3 is a perspective view of the substrate transport robot TR shown in FIG. 1.

The substrate transport robot TR comprises an arm mechanism 11, a lifting unit 12, and a rotating unit 13. The lifting unit 12 is provided on the rotating unit 13, and the arm mechanism 11 is provided on the lifting unit 12.

The arm mechanism 11 is provided with two arms 111 and 112 for holding the substrate W and a camera 10. Used as the camera 10 is a video camera, a digital camera, or the like using a CCD (Charge Coupled Device) or the like. The arms 111 and 112 extend toward each of the processing units from the substrate transport robot TR, thereby allowing access to the processing unit. The details of the arms 111 and 112 and the camera 10 will be described in detail later.

The lifting unit 12 has a so-called telescopic structure which expands and contracts in a vertical direction. The lifting unit 12 expands and contracts, thereby making it possible to raise and lower the arm mechanism 11. Consequently, the arms 111 and 112 can access each of the liquid processing units and the processing unit in the arbitrary stage in each of the multi-stage thermal processing units.

The rotating unit 13 is rotated around a vertical axis at the center of the substrate transport robot TR by a rotating motor (not shown). Consequently, the arm mechanism 11 is also rotated. Consequently, the arms 111 and 112 can access the arbitrary processing unit.

Figure 4:
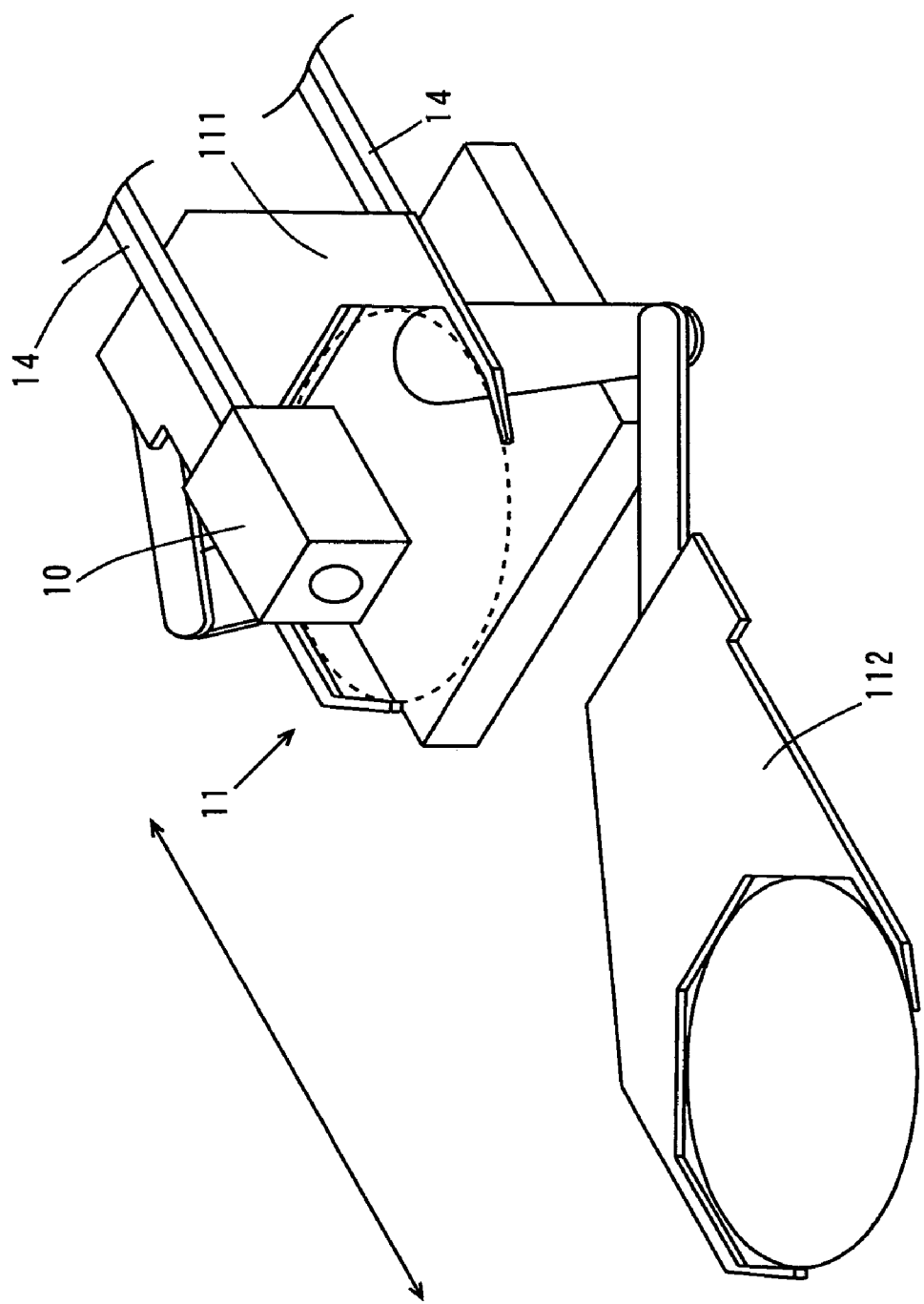
FIG. 4 is an enlarged perspective view of an arm mechanism shown in FIG. 3.

FIG. 4 is an enlarged perspective view of the arm mechanism 11 shown in FIG. 3.

As shown in FIG. 4, the camera 10 is fixed to a camera fixture 14 extending forward and upward from a rear end of the arm mechanism 11. It is preferable that the camera 10 is attached parallel to the direction of extension of the arms 111 and 112 so as to make an angle at which the direction of extension (direction of forward movement) of the arms 111 and 112 can be picked up.

The camera 10 always picks up the direction of extension of each of the arms by the lifting operation and the rotating operation of the substrate transport robot TR. Therefore, the camera 10 can always pick up conditions outside and inside of the arbitrary processing unit in a case where the arms 111 and 112 extend toward the processing unit. Particularly, each of the processing units is picked up as a still image when the substrate W is carried into and out of the processing unit. The details will be described later.

Figure 5:
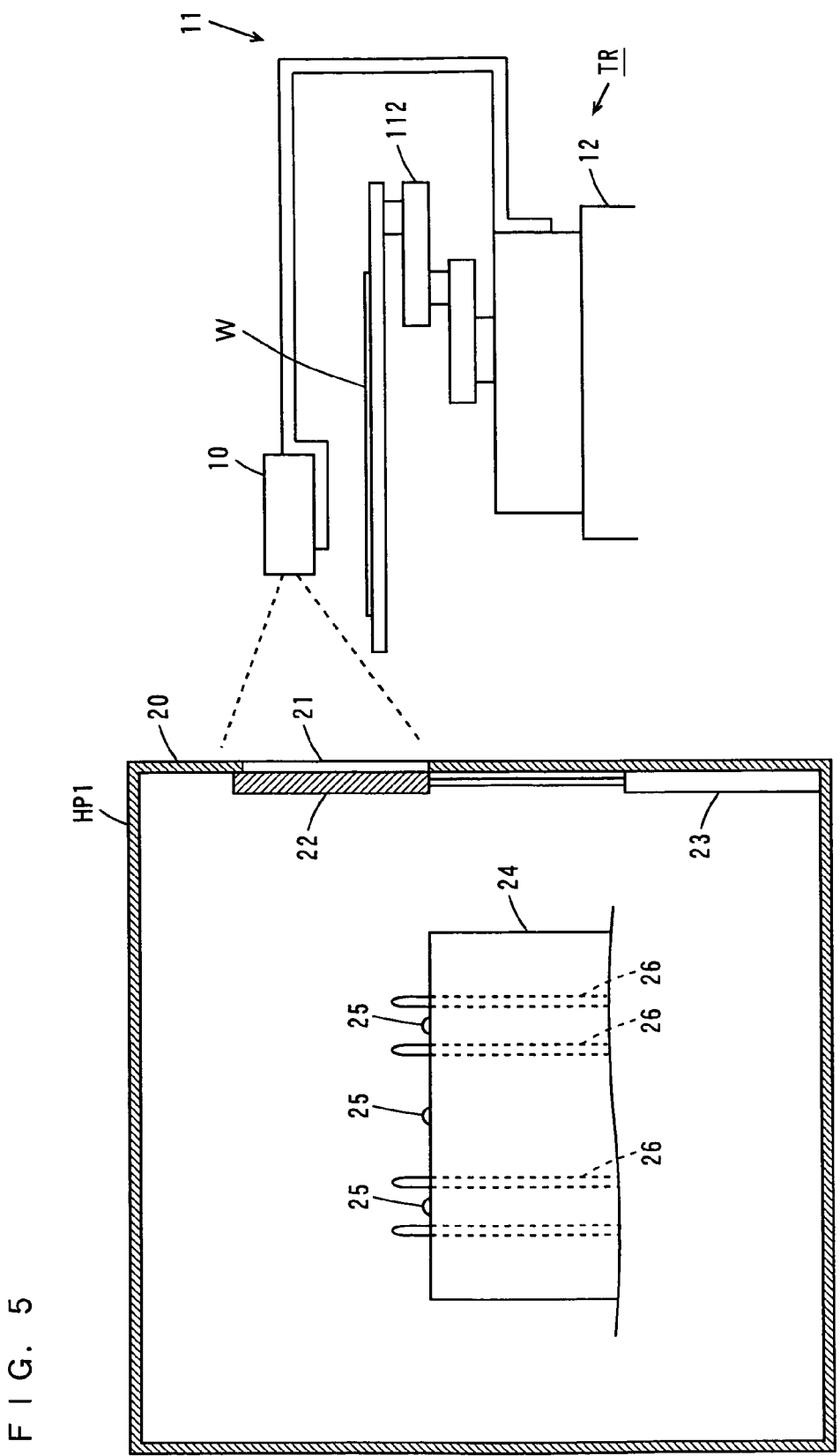
FIG. 5 is a schematic sectional view of a hot plate unit and a transport robot.

FIG. 5 is a schematic sectional view of the hot plate unit HP1 and the substrate transport robot TR. For simplicity, the arm 111 in the substrate transport robot TR is omitted.

As shown in FIG. 5, the hot plate unit HP1 comprises a case 20 having a substrate carry-in/carry-out opening 21. A shutter 22 is provided in the opening 21 of the case 20 so as to be capable of being opened or closed by a driving device 23 such as an air cylinder.

A heating plate 24 is provided within the case 20. Three spherical spacers 25 for supporting the back surface of the substrate W are arranged in the shape of a substantially regular triangle on an upper surface of the heating plate 24.

The heating plate 24 is formed with a plurality of through holes. In the present embodiment, the number of through holes is six. An lifting pin 26 for supporting the back surface of the substrate W is provided within each of the through holes. The plurality of lifting pins 26 are moved perpendicularly up and down by a substrate lifting device (not shown).

When the substrate W is carried into the hot plate unit HP1, the shutter 22 is opened, and the plurality of lifting pins 26 are at their uppermost positions. When the substrate W is transferred to the plurality of lifting pins 26 by the substrate transport robot TR, the plurality of lifting pins 26 fall so that the substrate W is placed on the plurality of spherical spaces 25. Thereafter, the shutter 22 is closed so that the substrate W is subjected to predetermined thermal processing.

After the thermal processing, the plurality of lifting pins 26 lift the substrate W placed on the spherical spacers 25 to rise to their uppermost positions. The shutter 22 is then opened so that the substrate transport robot TR receives the substrate W and carries the received substrate W out of the hot plate unit HP1. Thereafter, the plurality of lifting pins 26 fall.

The camera 10 picks up the direction of extension of the arms 111 and 112 as a still image when the substrate W is carried in and out. If a normal still image in the hot plate unit HP1 previously recorded and the still image picked up by the camera 10 coincide with each other, the substrate transport robot TR carries in or out the substrate W. The details will be described later.

Since the other thermal processing units such as the cooling plate unit CP, the post-exposure bake plate unit PEB, and the adhesion unit AH have the same structures as that of the hot plate unit HP1, the substrate transport robot TR performs the same operation when the substrate W is carried into and out of the thermal processing units such as the cooling plate unit CP, the post-exposure bake plate unit PEB, and the adhesion unit AH.

Figure 6:
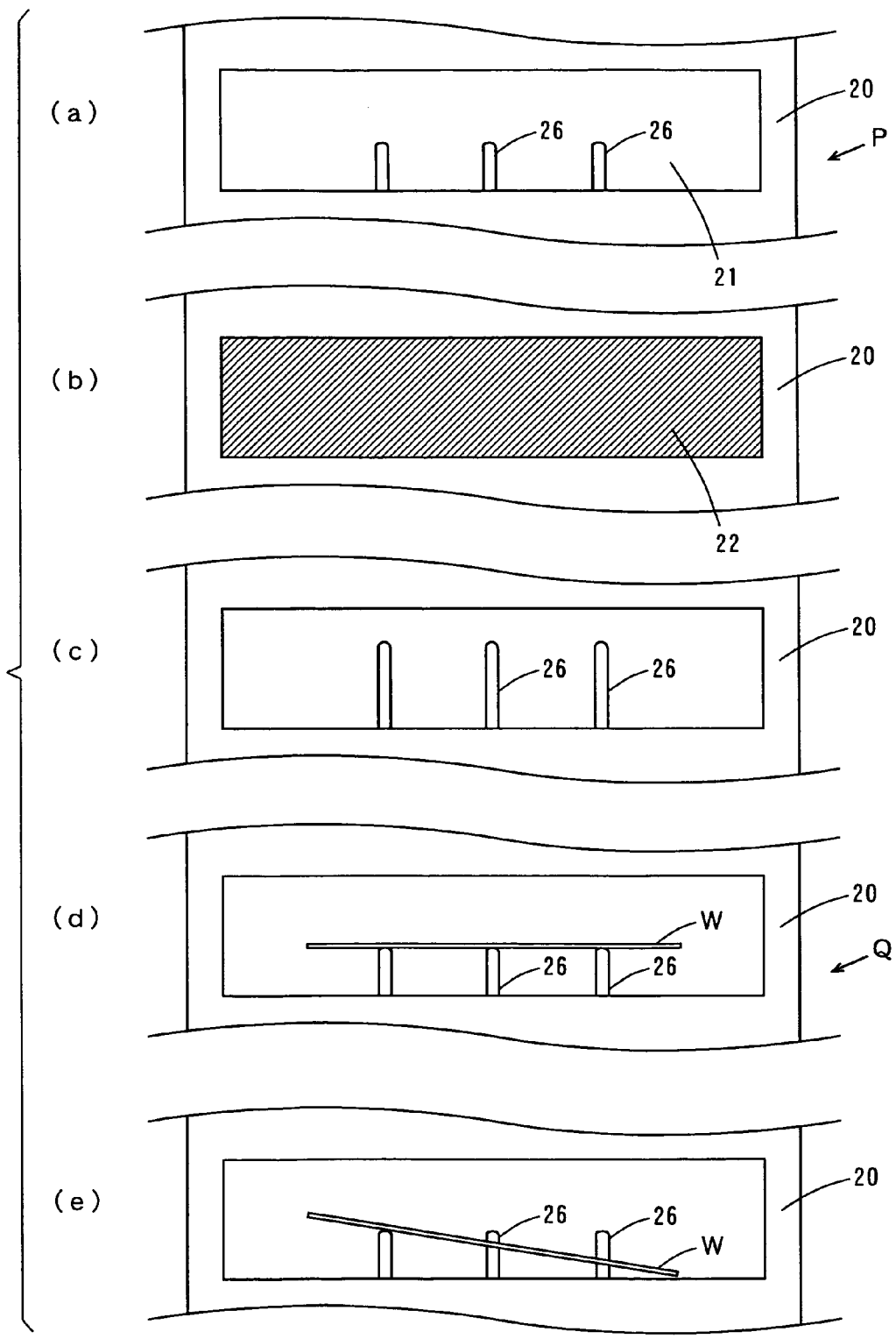
FIG. 6 is a diagram for explaining a still image picked up by a camera and a still image previously recorded.

FIG. 6 is a diagram for explaining the still image picked up by the camera 10 and the still image previously recorded.

FIG. 6(a) illustrates a reference image P previously recorded. In the reference image P, the shutter 22 is opened, and the plurality of lifting pins 26 shown in FIG. 5 are at their uppermost positions. In this case, no obstacle exists in an extension passage of the arms 111 and 112 shown in FIG. 4. In a case where the still image picked up by the camera 10 and the reference image P coincide with each other when the substrate W is carried into each of the thermal processing units, the substrate W is carried in.

FIG. 6(b) illustrates the still image, in a state where the shutter 22 is closed, picked up by the camera 100. The reference image P and the still image shown in FIG. 6(b) differ from each other. In a case where the still image obtained by the camera 10 when the substrate W is carried into each of the thermal processing units is as shown in FIG. 6(b), therefore, the substrate W is not carried in, so that the operation of the substrate processing apparatus 100 is stopped. Consequently, collisions of the arms 111 and 112 and the substrate W with the shutter 22 are prevented.

FIG. 6(c) illustrates the still image in a state where the plurality of lifting pins 26 excessively rise due to inferior operation. The reference image P and the still image shown in FIG. 6(c) differ from each other. In a case where the still image obtained by the camera 10 when the substrate W is carried into each of the thermal processing units is as shown in FIG. 6(c), therefore, the substrate W is not carried in, so that the operation of the substrate processing apparatus 100 is stopped. As a result, collisions between the substrate W and the plurality of lifting pins 26 are prevented.

FIG. 6(d) illustrates a reference image Q previously recorded. In the reference image Q, the plurality of lifting pins 26 are at their uppermost positions, and the substrate W is supported on the plurality of lifting pins 26. In a case where the still image obtained by the camera 10 when the substrate W is carried out of each of the thermal processing units and the reference image Q coincide with each other, the substrate W is carried out.

FIG. 6(e) illustrates the still image in a state where the substrate W falls down from the plurality of lifting pins 26. The still image and the reference image Q differ from each other. In a case where the still image obtained by the camera 10 when the substrate W is carried out of each of the thermal processing units is as shown in FIG. 6(e), therefore, the substrate W is not carried out, so that the operation of the substrate processing apparatus 100 is stopped. Consequently, collisions between the arms 111 and 112 and the substrate W are prevented.

In a case where the still image obtained by the camera 10 when the substrate W is carried out of each of the thermal processing units and the reference image Q do not coincide with each other, for example, a case where the lifting pins 26 are rising, the substrate W is not carried out. When the lifting pins 26 are rising, for example, therefore, the arms 111 and 112 are prevented from colliding with an obstacle such as the substrate W supported on the lifting pins 26.

Figure 7:
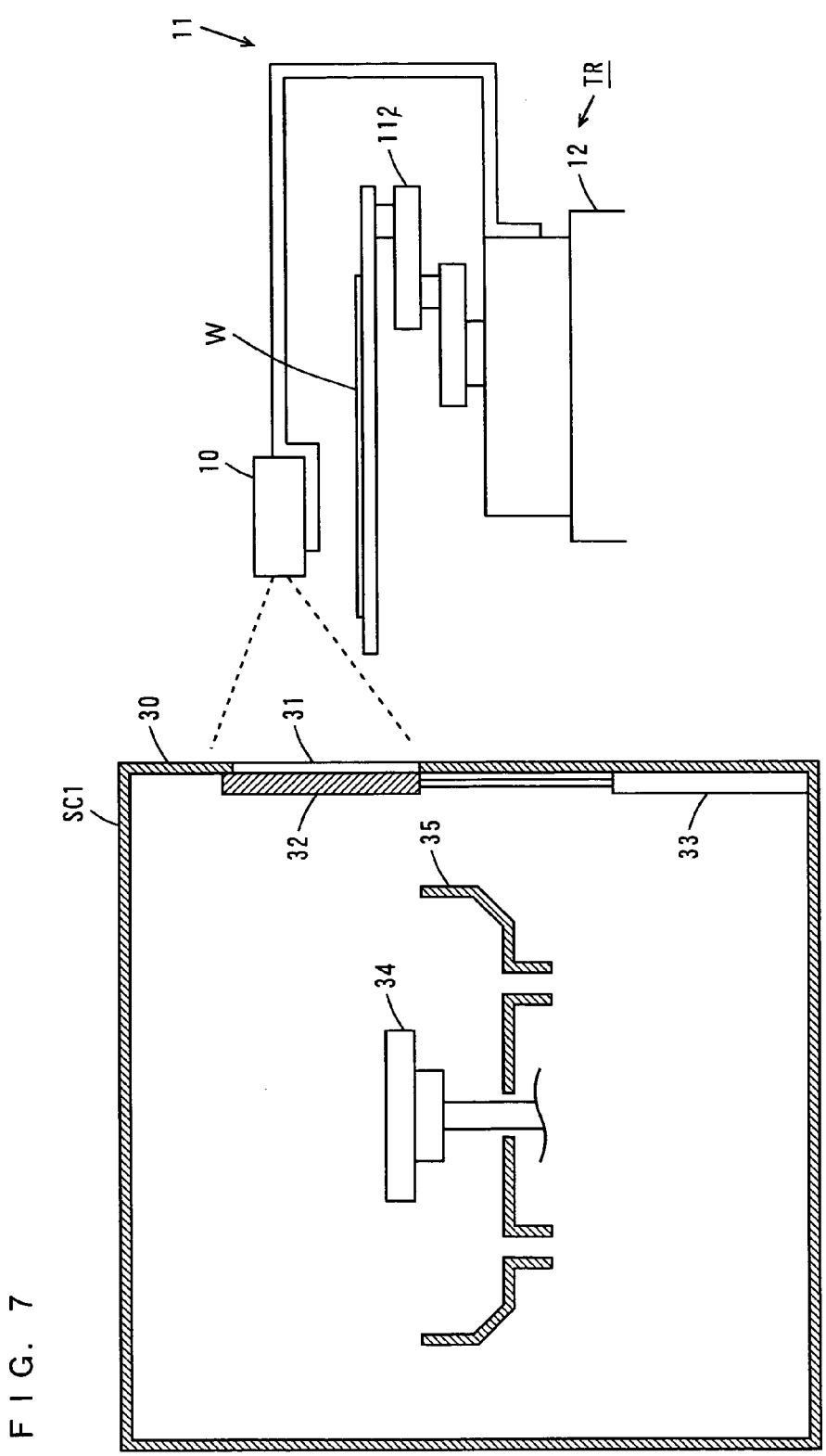
FIG. 7 is a schematic sectional view of a coating processing unit and a transport robot.

FIG. 7 is a schematic sectional view of the coating processing unit SC1 and the substrate transport robot TR.

As shown in FIG. 7, the coating processing unit SC1 comprises a case having a substrate carry-in/carry-out opening 31. A shutter 32 is provided in the opening 31 of the case 30 so as to be capable of being opened or closed by a driving device 33 such as an air cylinder.

A rotating and holding member 34 is provided so as to be rotatable around a vertical axis by a rotating device (not shown) in the case 30. Further, a cup 35 is provided so as to surround the rotating and holding member 34. The cup 35 can rise and fall.

When the substrate W is carried in, the shutter 32 is opened, and the cup 35 is at its lowermost position, so that the substrate W is transferred to the rotating and holding member 34 by the substrate transport robot TR. The cup 35 then rises, so that liquid processing is performed. After that, the substrate transport robot TR receives the substrate W from the rotating and holding member 34 and carries the received substrate W out of the coating processing unit SC1.

The camera 10 picks up the direction of extension of the arm mechanism 11 as a still image when the substrate W is carried in and out. If a normal still image in the coating processing unit SC1 previously recorded and the still image obtained by the camera 10 are equal to each other, the substrate transport robot TR carries in or out the substrate W. The details will be described later.

Since the other liquid processing units such as the coating processing unit SC2 and the development processing units SD1 and SD2 have the same structures as that of the coating processing unit SC1, the substrate transport robot TR performs the same operation when the substrate W is carried into and out of the other liquid processing units such as the coating processing unit SC2 and the development processing units SD1 and SD2.

Figure 8:
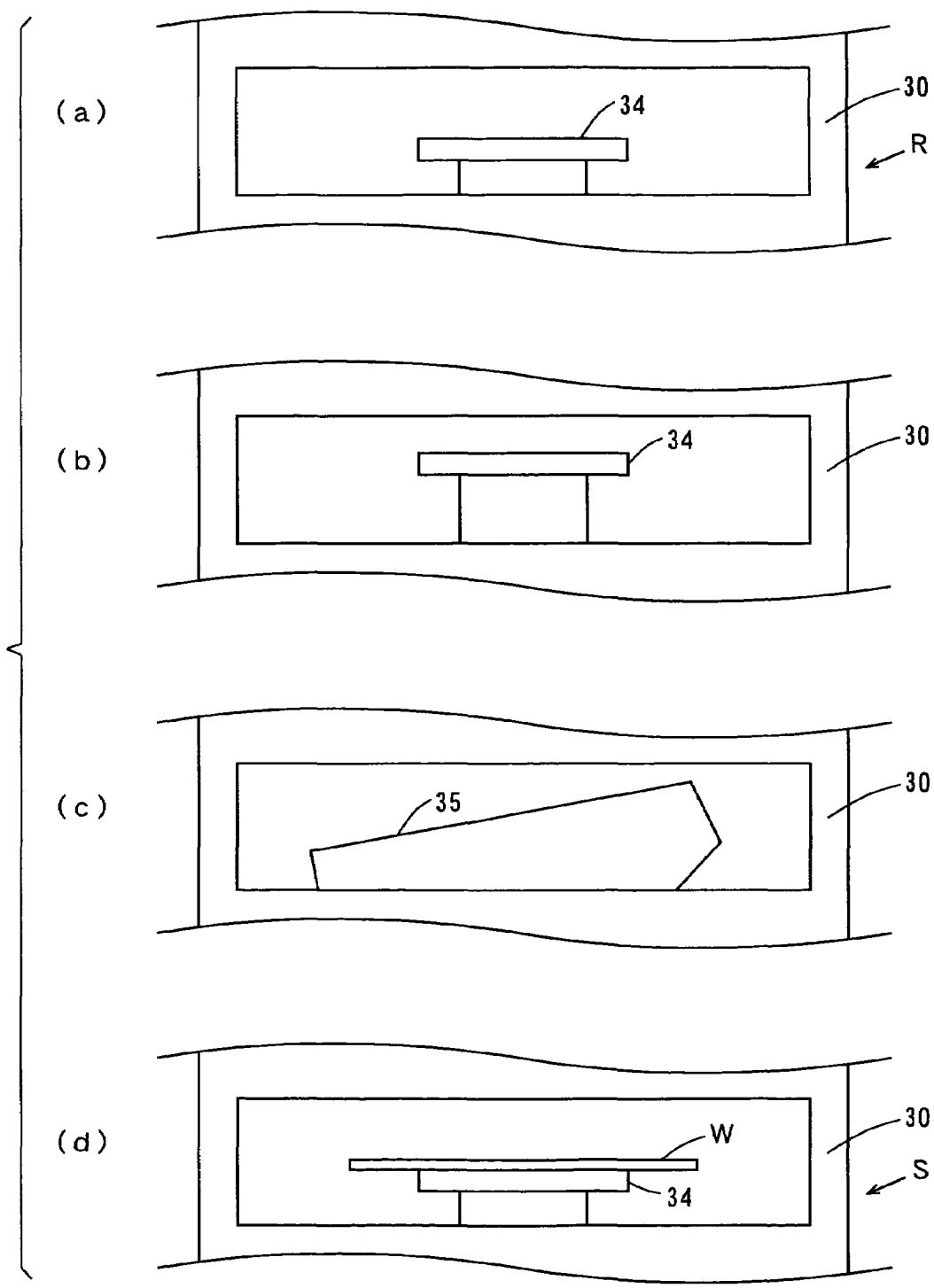
FIG. 8 is a diagram for explaining a still image picked up by a camera and a still image previously recorded.

FIG. 8 is a diagram for explaining the still image picked up by the camera 10 and the still image previously recorded.

FIG. 8(a) illustrates a reference image R previously recorded. In the reference image R, the shutter 32 is opened, and the cup 35 shown in FIG. 7 is at its lowermost position. In this case, no obstacle exists in the extension passage of the arms 111 and 112 shown in FIG. 4. In a case where the still image obtained by the camera 10 when the substrate W is carried into each of the liquid processing units and the reference image R coincide with each other, the substrate W is carried in.

FIG. 8(b) illustrates the still image in a state where the rotating and holding member 34 rises to a position higher than that in a normal state due to causes such as inferior mounting. The reference image R and the still image shown in FIG. 8(b) differ from each other. In a case where the still image obtained by the camera 10 when the substrate W is carried into each of the liquid processing units is as shown in FIG. 8(b), therefore, the substrate W is not carried in, so that the operation of the substrate processing apparatus 100 is stopped. Consequently, collisions of the arms 111 and 112 and the substrate W with the rotating and holding member 34 are prevented.

FIG. 8(c) illustrates the still image in a state where the cup 35 is unfastened and inclined. The reference image R and the still image shown in FIG. 8(b) differ from each other. In a case where the still image obtained by the camera 10 when the substrate W is carried into each of the liquid processing units is as shown in FIG. 8(c), therefore, the substrate W is not carried in, so that the operation of the substrate processing apparatus 100 is stopped. Consequently, collisions of the arms 111 and 112 and the substrate W with the cup 35 are prevented.

Even in a case where the shutter 32 is closed, as shown in FIG. 6(b), the substrate W is not carried in, so that the operation of the substrate processing apparatus 100 is stopped. Consequently, collisions of the arms 111 and 112 and the substrate W with the shutter 32 are prevented.

FIG. 8(d) illustrates a reference image S previously recorded. In the reference image S, the substrate W is supported on the rotating and holding member 34 at a normal position. In a case where the still image obtained by the camera 10 when the substrate W is carried out of each of the liquid processing units and the reference image Q coincide with each other, the substrate W is carried out.

On the other hand, in a case where the still image obtained by the camera 10 when the substrate W is carried out of each of the liquid processing units and the reference image S do not coincide with each other, the substrate W is not carried out. In cases such as a case where the cup 35 is unfastened, therefore, the arms 111 and 112 are prevented from colliding with an obstacle such as the cup 35.

Figure 9:
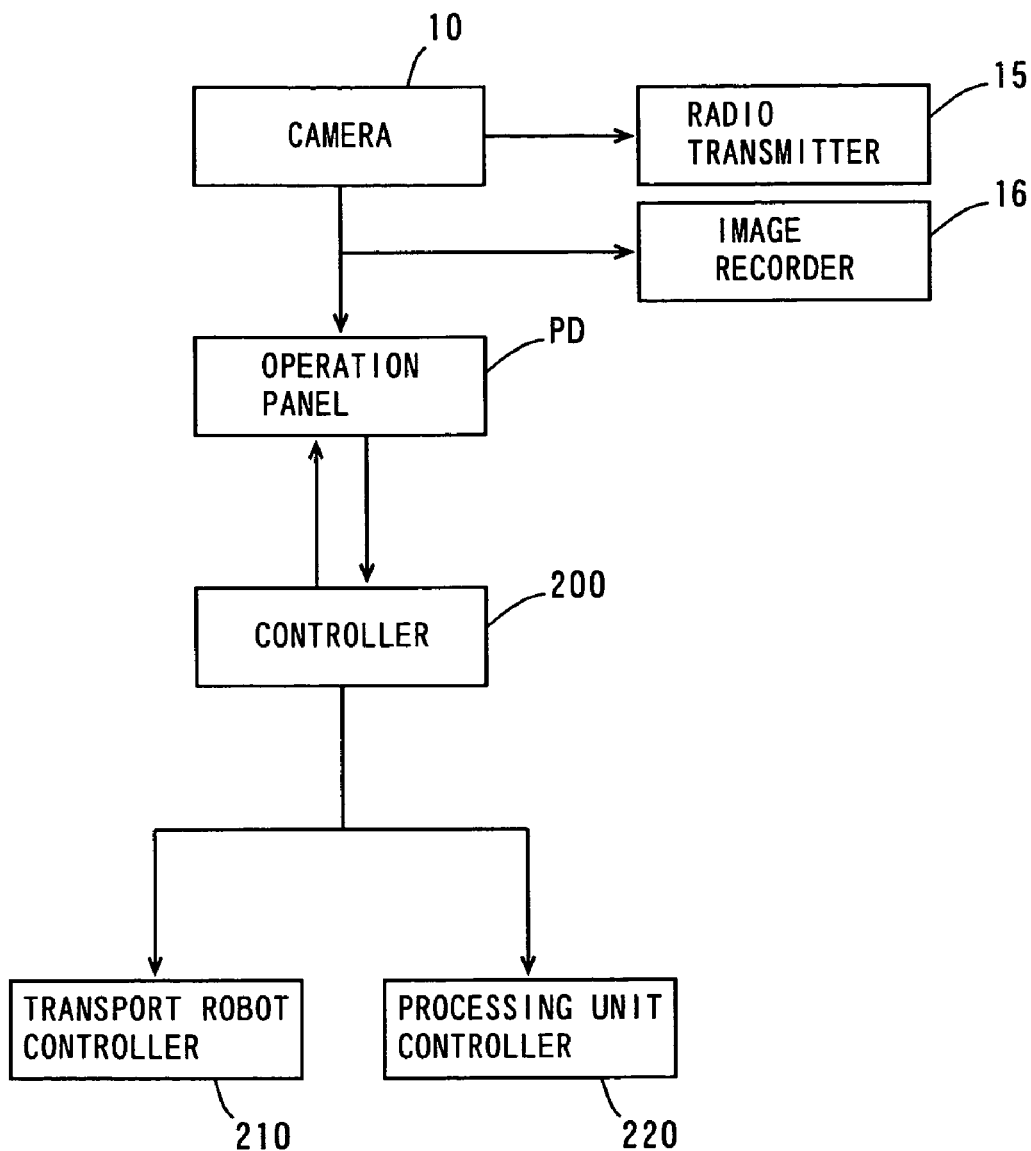
FIG. 9 is a block diagram showing a control system in a substrate processing apparatus.

FIG. 9 is a block diagram showing a control system in the substrate processing apparatus 100.

A transport robot controller 210 for controlling the driving of the substrate transport robot TR and a processing unit controller 220 for controlling a processing operation or the like in each of the processing units are connected to a controller 200. Further, an operation panel PD is connected to the controller 200, so that information for notifying a user of the contents of processing is displayed on the operation panel PD, and the user can enter an instruction command set by the operation panel PD.

The camera 10 is connected to a radio transmitter 15, an image recorder 16, and the operation panel PD. The camera 10 picks up the inside of the substrate processing apparatus 100, and a moving image (moving picture) obtained by the camera 10 is fed as moving image data to the radio transmitter 15, the image recorder 16, and the operation panel PD. The moving image data fed to the image recorder 16 is recorded and stored in the image recorder 16.

Furthermore, the camera 10 picks up the inside of the substrate processing apparatus 100 when the substrate is carried into and out of each of the processing units. The moving image obtained by the camera 10 is recorded as moving image data on the image recorder 16. The reference images P, Q, R, and S shown in FIGS. 6 and 8 are previously recorded on the image recorder 16. An example of the image recorder 16 is a data recording device for recording data on a magnetic tape, a magnetic disk, a hard disk unit, or the like.

The controller 200 determines whether or not the reference images P, Q, R, and S recorded on the image recorder 16 coincide with the still image recorded on the image recorder 16.

The radio transmitter 15 is a mechanism for transmitting the moving image data fed from the camera 10 to an external device by radio. The moving image data transmitted from the radio transmitter 15 is received by the external device, and the moving image data is displayed as a moving image, thereby making it possible for the user to confirm conditions within the substrate processing apparatus 100 even from a place spaced apart from the substrate processing apparatus 100.

The operation panel PD can display the moving image data fed from the camera 10 or the moving image data recorded and stored in the image recorder 16 as a moving image. Consequently, the user can confirm the operating conditions within the substrate processing apparatus 100. The operation panel PD also displays the information from the controller 200, as described above.

Contents displayed on the operation panel PD are determined by the user. When trouble arises within the substrate processing apparatus 100, the displayed contents may be switched by a display switching instruction from the controller 200. The moving image within the substrate processing apparatus 100 is then displayed on the operation panel PD, thereby making it possible for the user to always confirm the conditions within the substrate processing apparatus 100.

Description is herein made of a case where the transport robot controller 210 drives the substrate transport robot TR to detect the trouble while the substrate W is being carried in and out.

The transport robot controller 210 reports an abnormality to the controller 200 when it detects trouble. Since the controller 200 transmits sequential instructions to the transport robot controller 210 when it operates the substrate transport robot TR, it can recognize a position where the substrate transport robot TR causes the trouble.

Therefore, the controller 200 can transmit a driving signal to the transport robot controller 210 to move the camera 100 to the vicinity of the position where the trouble arises.

Furthermore, the controller 200 may be able to output a driving signal to the transport robot controller 210 by the user entering indication of the direction of movement of the camera 10 from the operation panel PD.

The controller 200 can thus move the camera 10 to an arbitrary position within the substrate processing apparatus 100, thereby making it possible for the user to easily confirm conditions within the substrate processing apparatus 100 in a case where trouble arises.

As a result, even when trouble arises in a place which is difficult to confirm the inside the substrate processing apparatus 100 from the exterior, the user can reflect the conditions within the substrate processing apparatus 100 on the operation panel PD to determine whether or not the substrate transport robot TR in a stopped state may be operated. Further, it is possible to previously prevent secondary trouble such as damage to the substrate W as well as to rapidly and accurately cope with the trouble.

Furthermore, the controller 200 sequentially records instructions issued to the transport robot controller 210 and the processing unit controller 220 as log files. Therefore, the user can confirm the instruction issued by the controller 200 using the log file when the cause of the trouble is investigated. The user can confirm an actual operation corresponding to the instruction by moving image data and still image data which are recorded and stored in the image recorder 16. Therefore, it is possible to easily investigate the cause of the trouble.

Figure 10:
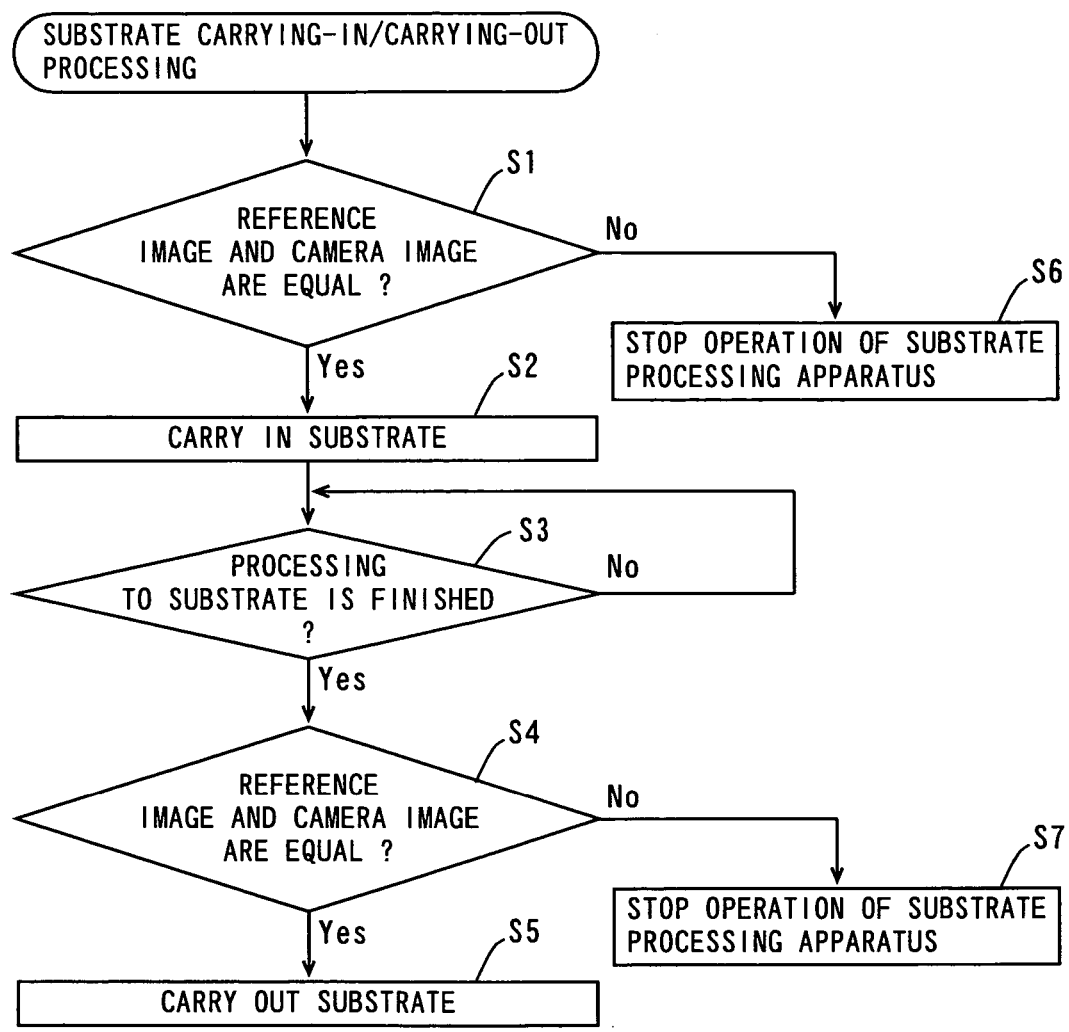
FIG. 10 is a flow chart showing processing for carrying a substrate into and out of a thermal processing unit.

FIG. 10 is a flow chart showing processing for carrying the substrate W into and out of the thermal processing unit. Referring now to FIGS. 6 and 9, the flow chart shown in FIG. 10 will be described.

As shown in FIG. 10, the controller 200 determines whether or not the reference image P shown in FIG. 6(a) coincides with the still image obtained by the camera 10. When the reference image P and the still image obtained by the camera 10 coincide with each other, the controller 200 carries in the substrate W (step S2).

The controller 200 then determines whether the substrate W has been processed (step S3). When the substrate W has not been processed, the controller 200 waits until the processing is finished. When the substrate W has been processed, the controller 200 determines whether or not the reference image Q shown in FIG. 6(d) coincides with the still image obtained by the camera 10 (step S4).

When the reference image Q and the still image obtained by the camera 10 coincide with each other, the controller 200 carries out the substrate W (step S5).

When the reference image P and the still image obtained by the camera 10 do not coincide with each other in the step Si, the controller 200 stops the operation of the substrate processing apparatus 100. When the reference image Q and the still image obtained by the camera 10 do not coincide with each other in the step S4, the controller 200 also stops the operation of the substrate processing apparatus 100.

From the foregoing, the substrate W is carried in and out in a case where there is no obstacle at the time of carrying in and out the substrate W. Consequently, collisions of the substrate W and the arms 111 and 112 shown in FIG. 5 with an obstacle are reliably prevented.

In a case where the substrate W is carried into and out of each of the liquid processing units, it is determined in the step Si that the still image obtained by the camera 10 and the reference image R shown in FIG. 8(a) coincide with each other. It is determined in the step S4 whether or not the still image obtained by the camera 10 and the reference image S shown in FIG. 8(d) coincide with each other.

In the present embodiment, the substrate transport robot TR corresponds to a substrate transport device, the controller 200 corresponds to a controller, the camera 10 corresponds to an obstacle detecting device and an image pick-up device, and the image recorder 16 corresponds to a storage device.

(Second Embodiment)

Figure 11:
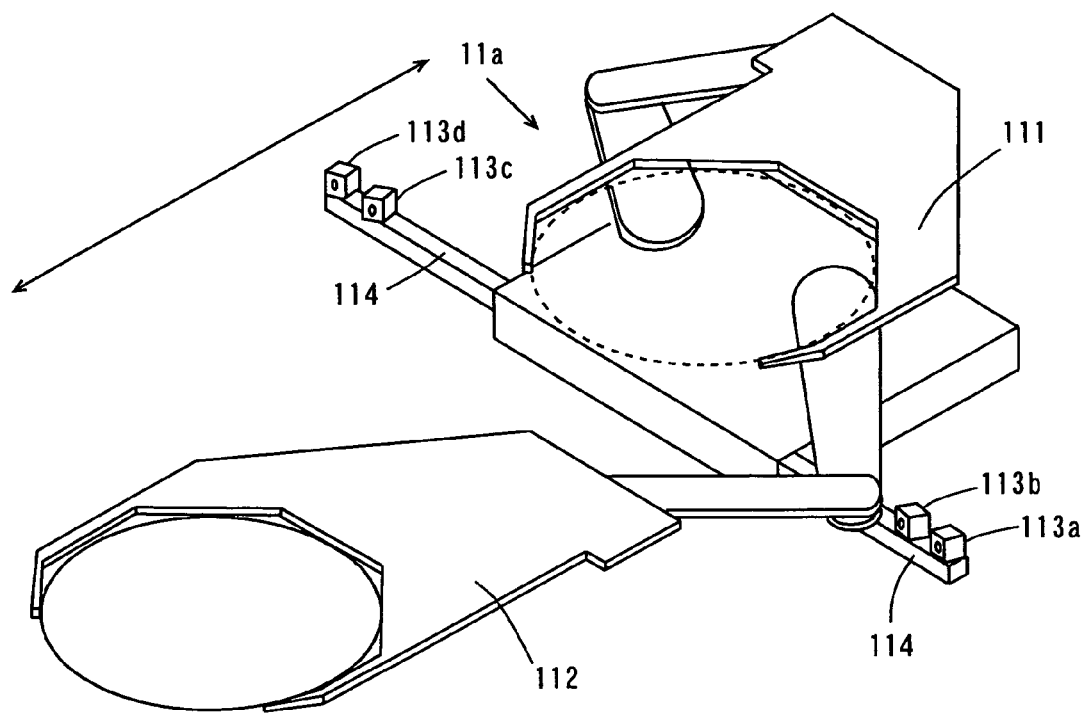
FIG. 11 is a perspective view of an arm mechanism of a substrate transport robot according to a second embodiment.

FIG. 11 is a perspective view of an arm mechanism 11a in a substrate transport robot TRa according to a second embodiment.

As shown in FIG. 11, the arm mechanism 11a differs from the arm mechanism 11 shown in FIG. 4 in that the camera 10 is replaced with obstacle sensors 113a to 113d and a pair of sensor supports 114.

The pair of sensor supports 114 is respectively mounted on both front ends of the arm mechanism 11a. The obstacle sensors 113a and 113b are mounted on a front end of one of the sensor supports 114, and the obstacle sensors 113c and 113d are mounted on a front end of the other sensor support 114.

Each of the obstacle sensors 113a to 113d is composed of an optical reflecting sensor, a ultrasonic reflecting sensor, etc. Each of the obstacle sensors 113a to 113d detects an obstacle in the direction of extension (the direction of forward movement) of arms 111 and 112.

Figure 12:
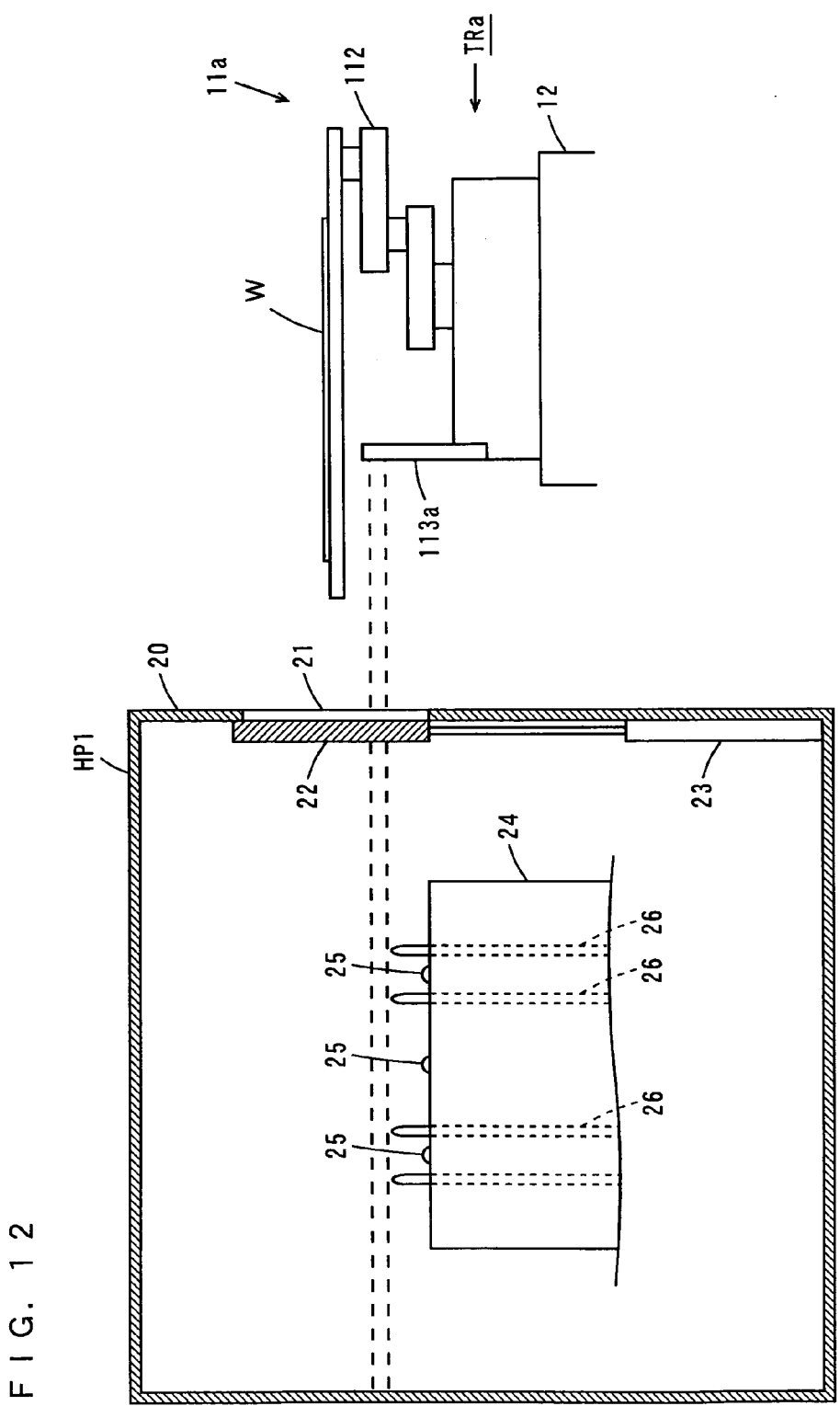
FIG. 12 is a schematic sectional view of a hot plate unit and a substrate transport robot in a case where a substrate is carried into the hot plate unit.

FIG. 12 is a schematic sectional view of a hot plate unit HP1 and a substrate transport robot TRa in a case where a substrate W is carried into the hot plate unit HP1.

Each of the obstacle sensors 113a to 113d detects an obstacle such as a shutter 22 and a plurality of lifting pins 26 in the direction of extension of the arm mechanism 11a. If no obstacle is detected by the obstacle sensors 113a to 113d, the substrate transport robot TRa carries in the substrate W. On the other hand, if an obstacle is detected by the obstacle sensors 113a to 113d, the operation of a substrate processing apparatus 100a is stopped. Consequently, collisions of the arms 111 and 112 and the substrate W with the obstacle is prevented.

Figure 13:
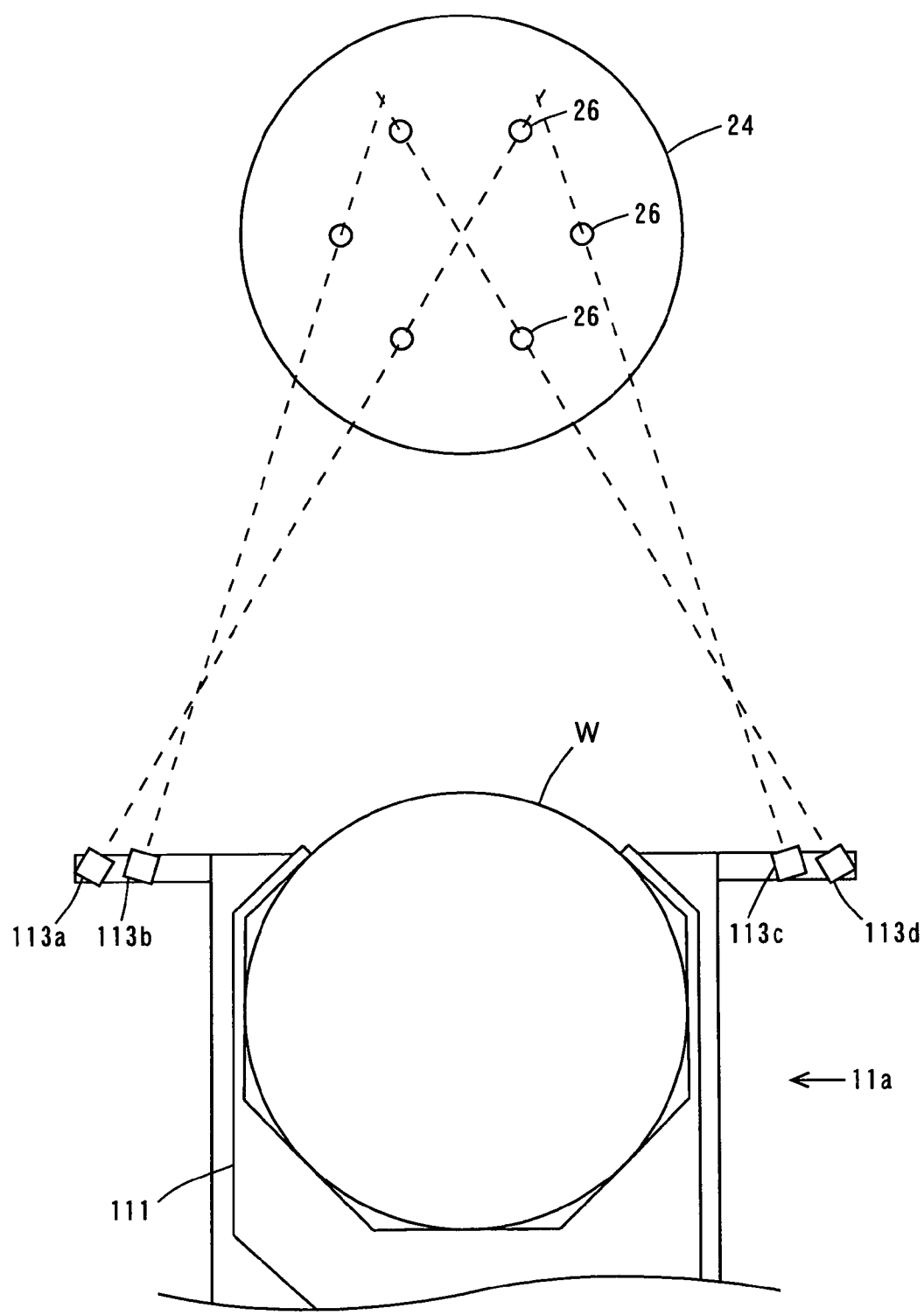
FIG. 13 is a schematic plan view of a hot plate unit and an arm mechanism.

FIG. 13 is a schematic plan view of the hot plate unit HP1 and the arm mechanism 11a.

As shown in FIG. 13, the obstacle sensors 113a to 113d detect the presence or absence of the plurality of lifting pins 26. The hot plate unit HP1 according to the present embodiment has six lifting pins. Each of the obstacle sensors 113a and 113d detects the two lifting pins 26 through the center of a vertical axis of a heating plate 24, and the obstacle sensors 113b and 113b respectively detect the lifting pins 26 which are not detected by the obstacle sensors 113a and 113d. Consequently, it is possible to reliably detect the presence or absence of the lifting pins 26.

FIG. 14 is a schematic sectional view of the hot plate unit HP1 and the substrate transport robot TRa in a case where the substrate W is carried out of the hot plate unit HP1.

When the substrate W is carried out, the substrate transport robot TRa adjusts a lifting unit 12 shown in FIG. 14 such that the arm mechanism 11a is at its lower position, as compared with that at the time when the substrate W is carried in. In this case, if the plurality of lifting pins 26 rise to its uppermost positions, the obstacle sensors 113a to 113d detect the plurality of lifting pins 26.

When the obstacle sensors 113a to 113d detect the plurality of lifting pins 26, the substrate transport robot TRa extend the arms 111 and 112, to receive the substrate W from the plurality of lifting pins 26. On the other hand, when the obstacle sensors 113a to 113d do not detect the plurality of lifting pins 26, the substrate transport robot TRa does not extend the arms 111 and 112. Consequently, collisions between the substrate W which is rising by the plurality of lifting pins 26 and the arms 111 and 112 is prevented.

Figure 15:
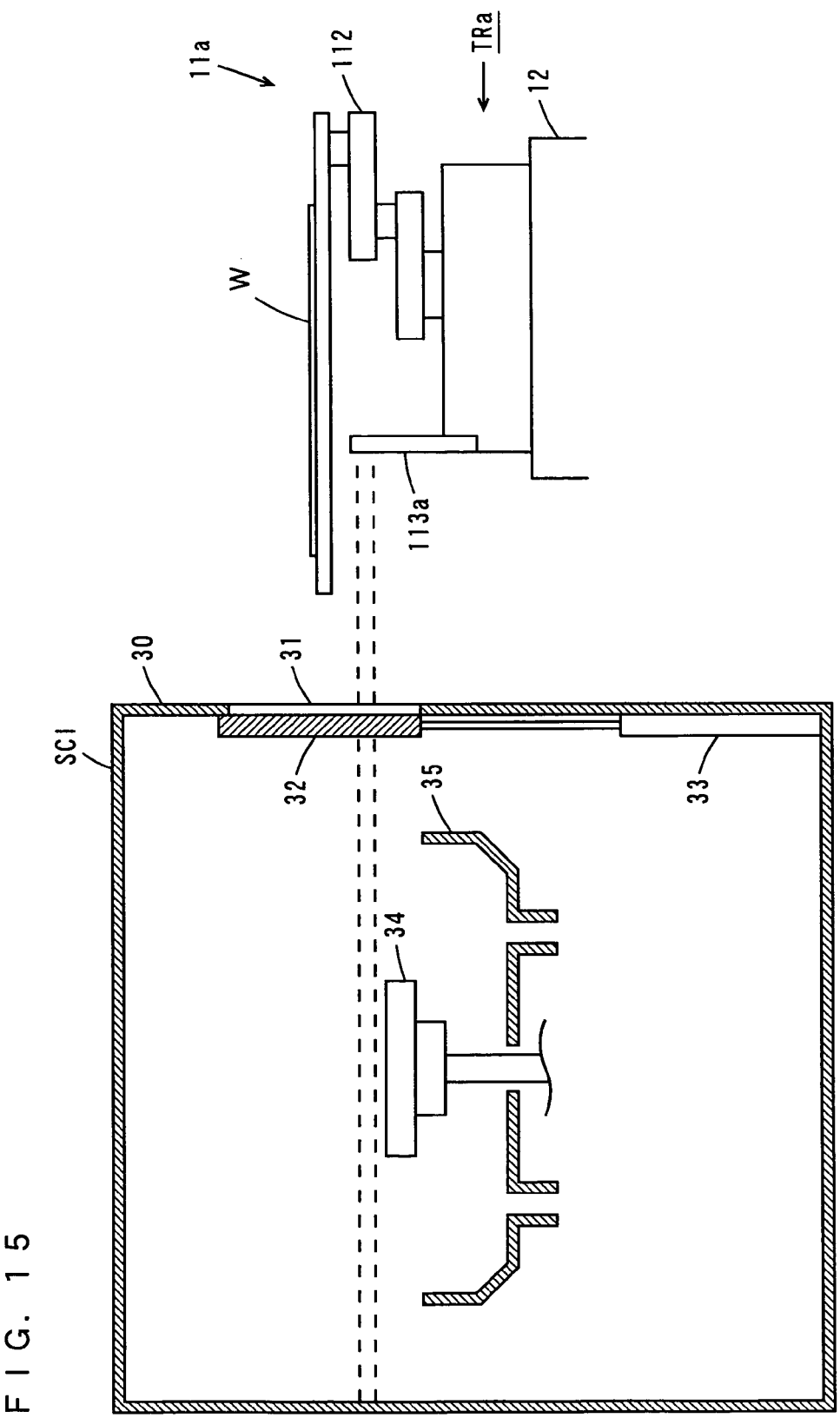
FIG. 15 is a schematic sectional view of a coating processing unit and a substrate transport robot in a case where a substrate is carried into and out of the coating processing unit.

FIG. 15 is a schematic sectional view of a coating processing unit SC1 and the substrate transport robot TRa in a case where the substrate W is carried into and out of the coating processing unit SC1.

The obstacle sensors 113a to 113d detect an obstacle such as a shutter 32, a rotating and holding member 34, and a cup 35 in the direction of extension of the arms 111 and 112. If no obstacle is detected by the obstacle sensors 113a to 113d, the substrate transport robot TRa extends the arms 111 and 112, to carry the substrate W in or out. On the other hand, if an obstacle is detected by the obstacle sensors 113a to 113d, the substrate transport robot TRa does not extend the arms 111 and 112, to carry the substrate W in or out.

Consequently, collisions of the substrate W and the arms 111 and 112 with the rotating and holding member 34 and the cup 35 are prevented at the time of carrying in the substrate W, while collisions of the arms 111 and 112 with the rotating and holding member 34, the cup 35, and the substrate W are prevented at the time of carrying out the substrate W.

Figure 16:
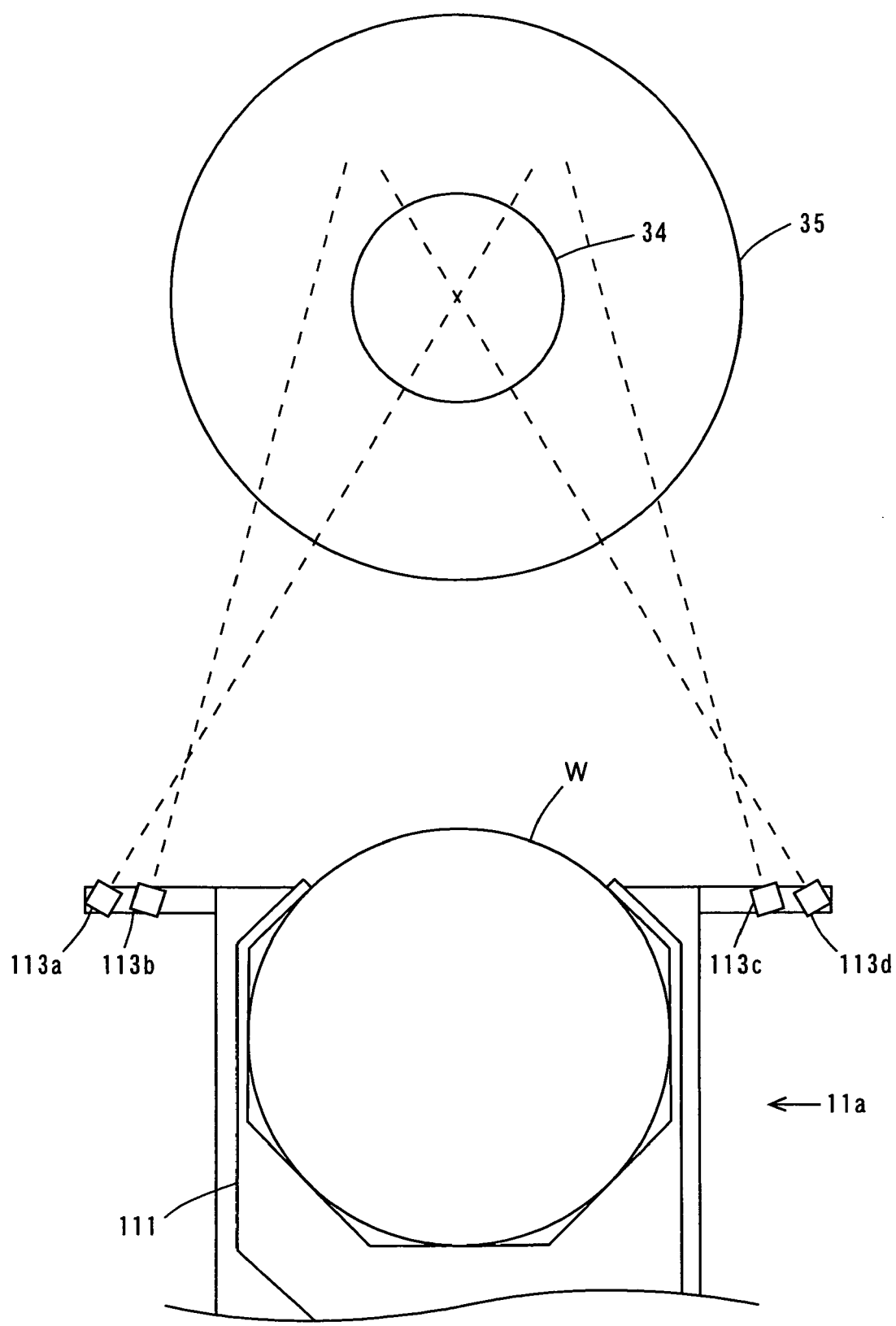
FIG. 16 is a schematic plan view of a coating processing unit and an arm mechanism.

FIG. 16 is a schematic plan view of the coating processing unit SC1 and the arm mechanism 11a.

As shown in FIG. 16, the obstacle sensors 113a to 113d detect the presence or absence of the rotating and holding member 34 and the cup 35. In the present embodiment, the obstacle sensors 113a and 113d detect the presence or absence of the rotating and holding member 34 and the cup 35. Consequently, it is possible to reliably detect an obstacle in the direction of extension of the arms Z111 and 112.

Figure 17:
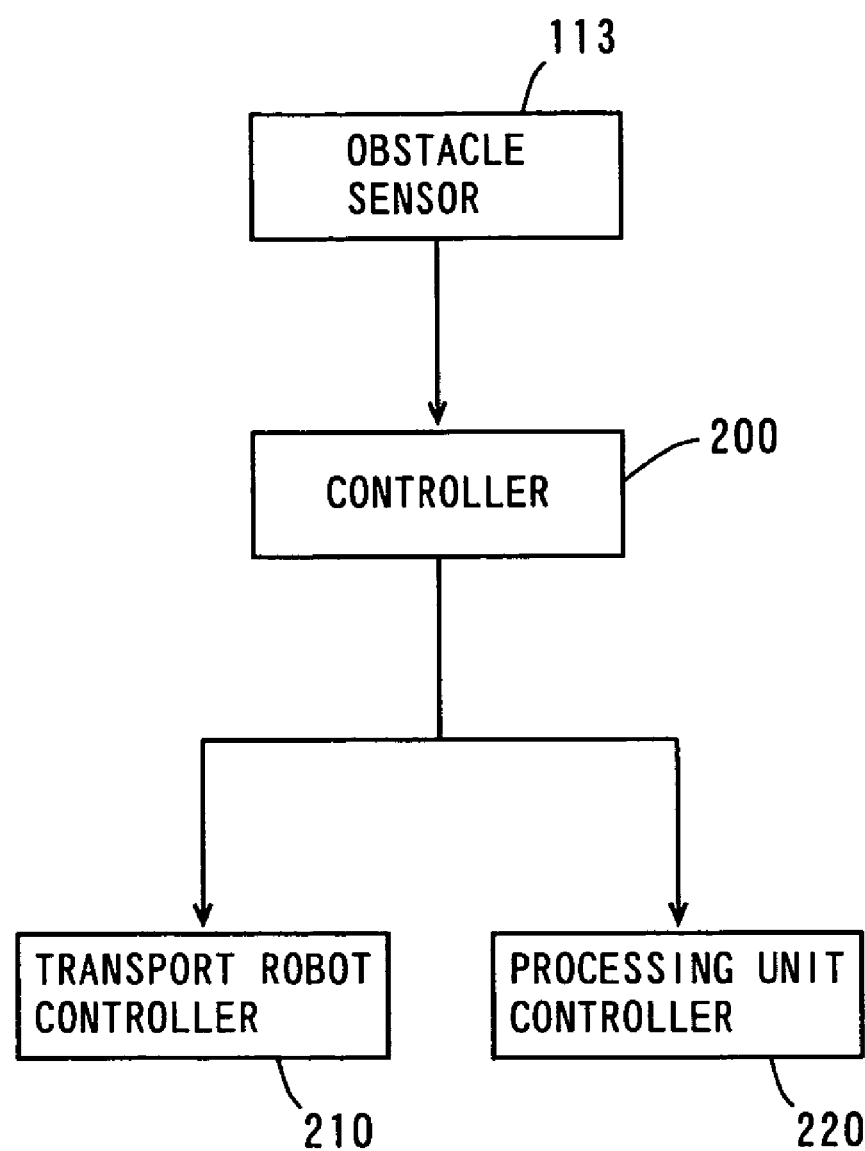
FIG. 17 is a block diagram showing a control system in a substrate processing apparatus according to a second embodiment.

FIG. 17 is a block diagram showing a control system in the substrate processing apparatus 100a according to the second embodiment.

FIG. 17 differs from the block diagram of FIG. 9 in that the camera 10, the radio transmitter 15, and the image recorder 16 are not provided, and an obstacle sensor 113 is connected to a controller 200.

An obstacle detection signal for detecting the obstacle sensor 113 is fed to the controller 200. The controller 200 controls the operations of a transport robot controller 210 and a processing unit controller 220 on the basis of the obstacle detection signal.

Figure 18:
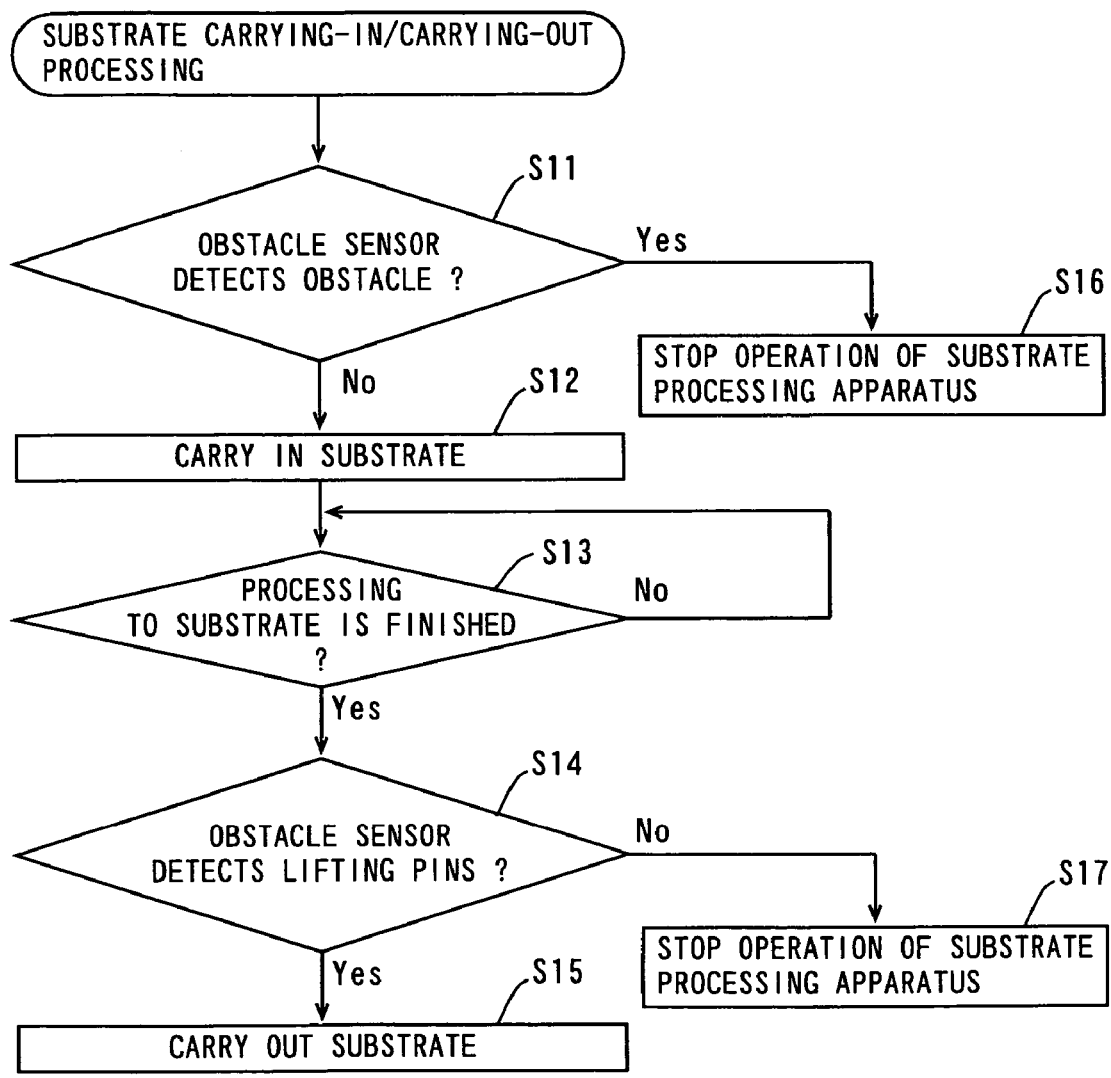
FIG. 18 is a flow chart showing processing for carrying a substrate into and out of each of thermal processing units in the substrate processing apparatus according to the second embodiment.

FIG. 18 is a flow chart showing processing for carrying the substrate W into and out of each of thermal processing units in the substrate processing apparatus 100a according to the second embodiment. Referring now to FIGS. 12, 14 and 17, the flow chart of FIG. 18 will be described.

As shown in FIG. 18, the controller 200 shown in FIG. 17 determines whether or not the obstacle sensors 113a to 113d shown in FIG. 12 detect an obstacle (step S11). When the obstacle sensors 113a to 113d detect no obstacle, the controller 200 carries in the substrate W (step S12).

The controller 200 then determines whether the substrate W has been processed (step S13). When the substrate W has not been processed, the controller 200 waits until the processing is finished. When the substrate W has been processed, the controller 200 determines whether or not the obstacle sensors 113a to 113d detect the plurality of lifting pins 26 shown in FIG. 14 (step S14).

When the obstacle sensors 113a to 113d detect the plurality of lifting pins 26, the controller 200 carries out the substrate W (step S15).

When the obstacle sensors 113a to 113d detect an obstacle in the step S11, the controller 200 stops the operation of the substrate processing apparatus 100a (step S16). When the obstacle sensors 113a to 113d do not detect the plurality of lifting pins 26 in the step S14, the controller 200 stops the operation of the substrate processing apparatus 100a (step S17).

From the foregoing, the substrate W is carried in when there is no obstacle, while being carried out when the positions of the lifting pins 26 are normal. Consequently, collisions of the substrate W and the arms 111 and 112 shown in FIG. 15 with the obstacle are reliably prevented.

Figure 19:
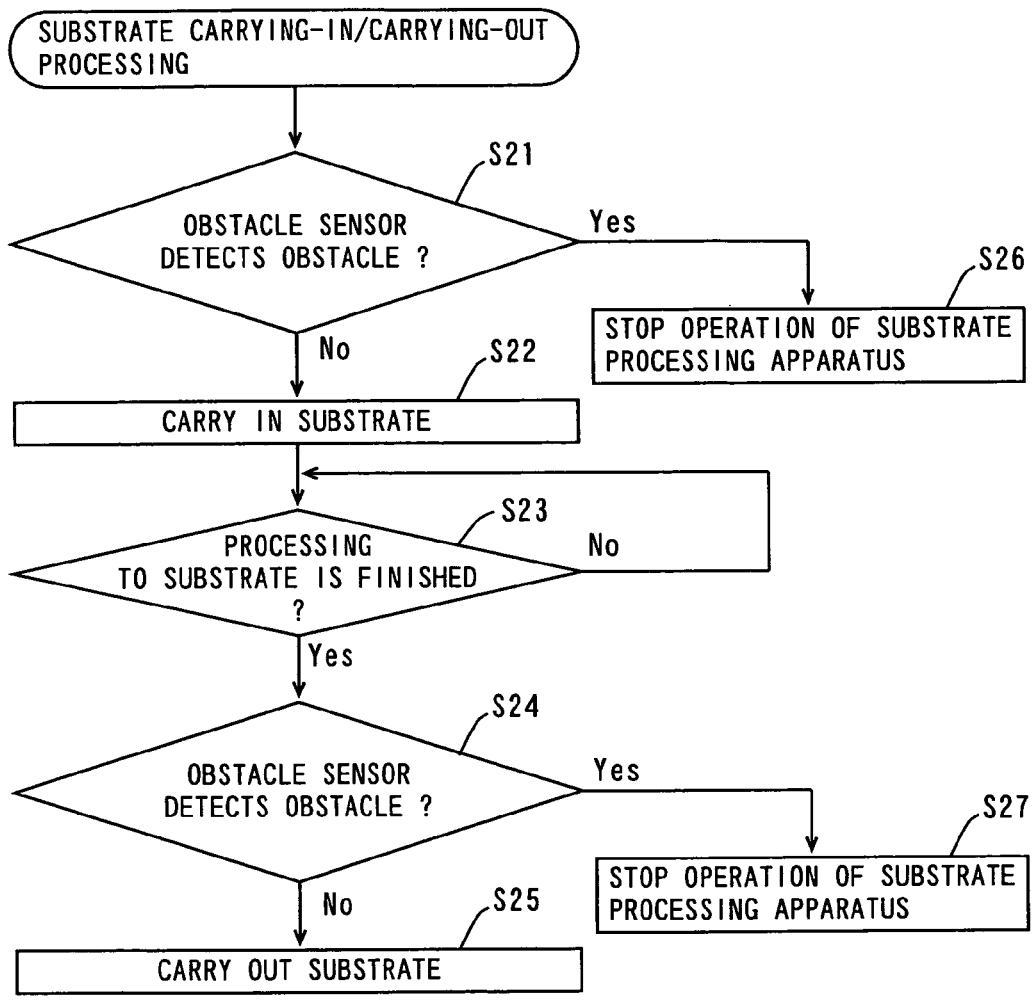
FIG. 19 is a flow chart showing processing for carrying a substrate into and out of a liquid processing unit in the substrate processing apparatus according to the second embodiment.

FIG. 19 is a flow chart showing processing for carrying the substrate W into and out of a liquid processing unit in the substrate processing apparatus 100a according to the second embodiment. Referring now to FIGS. 15 and 17, the flow chart of FIG. 19 will be described.

As shown in FIG. 19, the controller 200 shown in FIG. 17 determines whether or not the obstacle sensors 113a to 113d shown in FIG. 15 detects an obstacle (step S21). When the obstacle sensors 113a to 113d detect no obstacle, the controller 200 carries in the substrate W (step S22).

The controller 200 then determines whether the substrate W has been processed (step S23). When the substrate W has not been processed, the controller 200 waits until the processing is finished. When the substrate W has been processed, the controller 200 determines whether or not the obstacle sensors 113a to 113d detect an obstacle (step S24).

When the obstacle sensors 113a to 113d detect no obstacle, the controller 200 carries out the substrate W (step S25).

When the obstacle sensors 113a to 113d detect an obstacle in the step S21, the controller 200 stops the operation of the substrate processing apparatus 100a (step S26) When the obstacle sensors 113a to 113d detect an obstacle in the step S24, the controller 200 stops the operation of the substrate processing apparatus 100a (step S27).

From the foregoing, in a case where there is no obstacle, the substrate W is carried into and out of each of the liquid processing units. Consequently, collisions of the substrate W and the arms 111 and 112 shown in FIG. 15 with the obstacle is reliably prevented.

In the present embodiment, the obstacle sensors 113a and 113d correspond to detectors.

As described in the foregoing, in the substrate processing apparatus and the substrate processing method according to the present invention, collisions between the substrate transport device and an obstacle can be prevented. Therefore, the substrate processing apparatus and the substrate processing method according to the present invention are suitable for applications for subjecting the substrate to predetermined processing while carrying the substrate.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A substrate processing apparatus comprising:
a processing unit;
a substrate transport device that transports a substrate;
a controller that controls the operation of said substrate transport device; and
a storage device that stores a reference image indicative of a normal state of said processing unit,
wherein said substrate transport device includes an image pick-up device that obtains a still image in the direction toward said processing unit, and
said controller compares the still image obtained by said image pick-up device with the reference image stored in said storage device to control the operation of said substrate transport device in response to the results of the comparison.

2. The substrate processing apparatus according to claim 1, wherein
said controller causes said substrate transport device to transport the substrate when the still image obtained by said image pick-up device and the reference image stored in said storage device coincide with each other.

3. The substrate processing apparatus according to claim 2, wherein
said controller stops the operation of said substrate transport device when the still image obtained by said image pick-up device and the reference image stored in said storage device do not coincide with each other.

4. The substrate processing apparatus according to claim 1, wherein
said substrate transport device further includes a storage device that stores a reference image in the direction toward said processing unit, and
said controller stops the operation of said substrate transport device when the still image obtained by said image pick-up device and the reference image stored in said storage device do not coincide with each other.

5. The substrate processing apparatus according to claim 1, wherein
said image pick-up device obtains a still image at a substrate carry-in/carry-out opening of said processing unit.

6. The substrate processing apparatus according to claim 1, wherein
said substrate transport device further includes a detector that detects whether an obstacle is present in the direction toward said processing unit.

7. A substrate processing method comprising the steps of:
transporting a substrate by a substrate transport device;
storing a reference image indicative of a normal state of a processing unit by storage device:
obtaining a still image in a direction toward said processing unit by an image pick-up device provided in said substrate transport device; and
comparing the still image obtained by said image pick-up device with the reference image stored in said storage device to control the operation of said substrate transport device in response to the results of the comparison.

8. The substrate processing method according to claim 7, wherein
said step of controlling includes the step of causing said substrate transport device to transport the substrate when the still image obtained by said image pick-up device and the reference image stored in said storage device coincide with each other.

9. The substrate processing method according to claim 8, wherein
said step of controlling includes the step of stopping the operation of said substrate transport device when the still image obtained by said image pick-up device and the reference image stored in said storage device do not coincide with each other.

10. The substrate processing method according to claim 7, wherein
said step of controlling includes the step of stopping the operation of said substrate transport device when the still image obtained by said image pick-up device and the reference image stored in said storage device do not coincide with each other.

11. The substrate processing method according to claim 7, wherein
said step of obtaining the still image includes the step of obtaining an a still image at a substrate carry-in/carry-out opening of the processing unit by said image pick-up device.

12. The substrate processing method according to claim 7, further comprising the step of detecting whether an obstacle is present in the direction toward said processing unit by a detector.

* * * * *